United States Patent
Humphrey et al.

(10) Patent No.: US 11,756,811 B2
(45) Date of Patent: ***Sep. 12, 2023

(54) PICK AND PLACE MACHINE CLEANING SYSTEM AND METHOD

(71) Applicant: International Test Solutions, Inc., Reno, NV (US)

(72) Inventors: Alan E. Humphrey, Reno, NV (US); Bret A. Humphrey, Reno, NV (US); Jerry J. Broz, Longmont, CO (US); Wayne C. Smith, Reno, NV (US)

(73) Assignee: International Test Solutions, LLC, Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/460,929

(22) Filed: Jul. 2, 2019

(65) Prior Publication Data

US 2021/0005483 A1 Jan. 7, 2021

(51) Int. Cl.
| | | |
|---|---|---|
| *H01L 21/67* | (2006.01) | |
| *B65G 47/91* | (2006.01) | |
| *B08B 1/02* | (2006.01) | |
| *B08B 7/00* | (2006.01) | |
| *H01L 21/683* | (2006.01) | |

(52) U.S. Cl.
CPC ......... *H01L 21/67144* (2013.01); *B08B 1/02* (2013.01); *B08B 7/0028* (2013.01); *B65G 47/91* (2013.01); *H01L 21/6838* (2013.01)

(58) Field of Classification Search
None
See application file for complete search history.

(56) References Cited

U.S. PATENT DOCUMENTS

| | | |
|---|---|---|
| 2,971,208 A | 2/1961 | Moore et al. |
| 3,453,677 A | 7/1969 | Cutler |
| 3,644,953 A | 2/1972 | Christiansen |
| 3,675,265 A | 7/1972 | Landen et al. |
| 3,717,897 A | 2/1973 | Strickland |
| 3,945,079 A | 3/1976 | Westberg |
| 4,104,755 A | 8/1978 | Smith |
| 4,277,160 A | 7/1981 | Yamada |
| 4,334,780 A | 6/1982 | Pernick |
| 4,590,422 A | 5/1986 | Milligan |

(Continued)

FOREIGN PATENT DOCUMENTS

| | | |
|---|---|---|
| CN | 1643065 A | 7/2005 |
| CN | 1669677 A | 9/2005 |

(Continued)

OTHER PUBLICATIONS

English Machine Translation of CN 1889240.*

(Continued)

*Primary Examiner* — Nicole Blan

(57) ABSTRACT

A device, mechanism, and methodology for regular and consistent cleaning of the vacuum aperture, nozzle, and contacting surfaces of a pick-and-place apparatus and the pick-up tools of automated or manual semiconductor device and die handling machines are disclosed. The cleaning material may include a cleaning pad layer with one or more intermediate layers that have predetermined characteristics, regular geometrical features, and/or an irregular surface morphology.

12 Claims, 25 Drawing Sheets

(56) References Cited

U.S. PATENT DOCUMENTS

| | | |
|---|---|---|
| 4,832,772 A | 5/1989 | Noguchi et al. |
| 5,011,513 A | 4/1991 | Zador et al. |
| 5,192,455 A | 3/1993 | Marcel |
| 5,205,460 A | 4/1993 | Sato et al. |
| 5,220,279 A | 6/1993 | Nagasawa |
| 5,444,265 A | 8/1995 | Hamilton |
| 5,485,949 A | 1/1996 | Tomura et al. |
| 5,507,874 A | 4/1996 | Su et al. |
| 5,597,346 A | 1/1997 | Hempel, Jr. |
| 5,652,428 A | 7/1997 | Nishioka et al. |
| 5,671,119 A | 9/1997 | Huang et al. |
| 5,685,043 A | 11/1997 | LaManna et al. |
| 5,690,749 A | 11/1997 | Lee |
| 5,699,584 A | 12/1997 | Wieloch et al. |
| 5,746,928 A | 5/1998 | Yen et al. |
| 5,766,061 A | 6/1998 | Bowers |
| 5,778,485 A | 7/1998 | Sano et al. |
| 5,783,018 A | 7/1998 | Gore et al. |
| 5,814,158 A | 9/1998 | Hollander et al. |
| 5,930,857 A | 8/1999 | Ramos et al. |
| 5,946,184 A | 8/1999 | Kanno et al. |
| 5,968,282 A | 10/1999 | Yamasaka |
| 6,019,663 A | 2/2000 | Angell et al. |
| 6,030,674 A | 2/2000 | Onishi et al. |
| 6,056,627 A | 5/2000 | Mizuta |
| 6,118,290 A | 9/2000 | Sugiyama et al. |
| 6,121,058 A | 9/2000 | Shell et al. |
| 6,130,104 A | 10/2000 | Yamasaka |
| 6,142,076 A | 11/2000 | Corrado et al. |
| 6,170,116 B1 | 1/2001 | Mizuta |
| 6,183,677 B1 | 2/2001 | Usui et al. |
| 6,193,587 B1 | 2/2001 | Lin et al. |
| 6,224,470 B1 | 5/2001 | Hoey et al. |
| 6,256,555 B1 | 7/2001 | Bacchi et al. |
| 6,280,298 B1 | 8/2001 | Gonzales |
| 6,306,187 B1 | 10/2001 | Maeda et al. |
| 6,322,433 B1 | 11/2001 | Matsumura |
| 6,326,413 B1 | 12/2001 | Blackwell et al. |
| 6,355,495 B1 | 3/2002 | Fujino et al. |
| 6,366,112 B1 | 4/2002 | Doherty et al. |
| 6,474,350 B1 | 11/2002 | Mizuta |
| 6,507,393 B2 | 1/2003 | Batchelder |
| 6,523,208 B1 | 2/2003 | Muscato et al. |
| 6,646,455 B2 | 11/2003 | Maekawa et al. |
| 6,733,876 B1 | 5/2004 | Beardsley et al. |
| 6,741,086 B2 | 5/2004 | Maekawa et al. |
| 6,776,171 B2 | 8/2004 | Carptner |
| 6,777,966 B1 | 8/2004 | Humphrey et al. |
| 6,813,828 B2 | 11/2004 | Dlugokecki et al. |
| 6,817,052 B2 | 11/2004 | Grube |
| 6,821,620 B2 | 11/2004 | Namikawa et al. |
| 6,840,374 B2 | 1/2005 | Khandros et al. |
| 6,884,300 B2 | 4/2005 | Sato et al. |
| 6,888,344 B2 | 5/2005 | Maekawa et al. |
| 6,960,123 B2 | 11/2005 | Mitarai |
| 7,202,683 B2 | 4/2007 | Humphrey et al. |
| 7,254,861 B2 | 8/2007 | Morioka et al. |
| 7,306,849 B2 | 12/2007 | Buckholtz et al. |
| 7,530,887 B2 | 5/2009 | Jiang et al. |
| 7,575,790 B2 | 8/2009 | Terada |
| 7,621,436 B2 | 11/2009 | Mii |
| 7,655,316 B2 | 2/2010 | Parkhe |
| 7,779,527 B2 | 8/2010 | Yudovsky et al. |
| 7,866,530 B1 | 1/2011 | Riachentsev |
| 7,975,901 B2 | 7/2011 | Maeda et al. |
| 8,371,316 B2 | 2/2013 | Humphrey et al. |
| 8,790,466 B2 | 7/2014 | Broz et al. |
| 8,801,869 B2 | 8/2014 | Broz et al. |
| 8,876,983 B2 | 11/2014 | Widhalm |
| 9,093,481 B2 | 7/2015 | Levinson |
| 9,131,829 B2 | 9/2015 | Namikawa |
| 9,318,362 B2 | 4/2016 | Leung et al. |
| 9,452,455 B2 | 9/2016 | An |
| 9,595,456 B2 | 3/2017 | Humphrey et al. |
| 9,825,000 B1 | 11/2017 | Humphrey et al. |
| 9,833,818 B2 | 12/2017 | Humphrey et al. |
| 9,933,457 B2 | 4/2018 | Leikermoser |
| 9,941,148 B2 | 4/2018 | Gratix |
| 10,002,776 B2 | 6/2018 | Humphrey et al. |
| 10,109,504 B2 | 10/2018 | Humphrey et al. |
| 10,195,648 B2 | 2/2019 | Broz et al. |
| 10,361,169 B2 | 7/2019 | Humphrey et al. |
| 10,399,809 B2 | 9/2019 | Montoya |
| 10,406,568 B2 | 9/2019 | Humphrey et al. |
| 10,741,420 B2 | 8/2020 | Humphrey et al. |
| 10,766,057 B2 | 9/2020 | Tokashiki et al. |
| 10,792,713 B1 | 10/2020 | Humphrey et al. |
| 10,896,828 B2 | 1/2021 | Humphrey et al. |
| 11,035,898 B1 | 6/2021 | Humphrey et al. |
| 2001/0007421 A1 | 7/2001 | Marcuse et al. |
| 2002/0028641 A1 | 3/2002 | Okubo et al. |
| 2002/0071115 A1 | 6/2002 | Batchelder |
| 2002/0079349 A1 | 6/2002 | Macover |
| 2002/0096187 A1 | 7/2002 | Kuwata et al. |
| 2002/0097060 A1 | 7/2002 | Maekawa et al. |
| 2002/0102065 A1 | 8/2002 | Kiani |
| 2002/0112300 A1 | 8/2002 | Muhr-Sweeney |
| 2003/0027496 A1 | 2/2003 | Back et al. |
| 2003/0076490 A1 | 4/2003 | Clark |
| 2003/0092365 A1 | 5/2003 | Grube |
| 2003/0138644 A1 | 7/2003 | Khandros et al. |
| 2003/0180532 A1 | 9/2003 | Namikawa et al. |
| 2003/0200989 A1 | 10/2003 | Humphrey et al. |
| 2004/0029316 A1 | 2/2004 | Schnegg et al. |
| 2004/0083568 A1 | 5/2004 | Morioka et al. |
| 2004/0096643 A1 | 5/2004 | Sato et al. |
| 2004/0200515 A1 | 10/2004 | Saito et al. |
| 2005/0001645 A1 | 1/2005 | Humphrey et al. |
| 2005/0026552 A1 | 2/2005 | Fawcett et al. |
| 2005/0034743 A1 | 2/2005 | Kim et al. |
| 2005/0042958 A1 | 2/2005 | Namikawa et al. |
| 2005/0118414 A1 | 6/2005 | Namikawa |
| 2005/0126590 A1 | 6/2005 | Sato et al. |
| 2005/0255796 A1 | 11/2005 | Haga |
| 2005/0287789 A1 | 12/2005 | Tunaboylu |
| 2006/0008660 A1 | 1/2006 | Parkhe |
| 2006/0029441 A1 | 2/2006 | Ide |
| 2006/0065290 A1 | 3/2006 | Broz et al. |
| 2006/0076337 A1 | 4/2006 | Brunner et al. |
| 2006/0151004 A1 | 7/2006 | Terada et al. |
| 2006/0219754 A1 | 10/2006 | Clauberg et al. |
| 2006/0272678 A1 | 12/2006 | Corrado et al. |
| 2006/0289605 A1 | 12/2006 | Park et al. |
| 2007/0125491 A1 | 6/2007 | Yonemizu et al. |
| 2007/0140754 A1 | 6/2007 | Poxon et al. |
| 2007/0153062 A1 | 7/2007 | Shie et al. |
| 2007/0178814 A1 | 8/2007 | Sato et al. |
| 2007/0205753 A1 | 9/2007 | Hau et al. |
| 2007/0284419 A1 | 12/2007 | Matlack et al. |
| 2008/0023028 A1 | 1/2008 | Fujita |
| 2008/0070481 A1 | 3/2008 | Tamura et al. |
| 2008/0207095 A1 | 8/2008 | Goto |
| 2008/0242576 A1 | 10/2008 | Tamura et al. |
| 2009/0197404 A1 | 8/2009 | Yang |
| 2009/0212807 A1 | 8/2009 | Chen et al. |
| 2009/0227048 A1* | 9/2009 | Fang ................ H01L 21/67144 438/15 |
| 2009/0248128 A1 | 10/2009 | Nassif et al. |
| 2010/0132736 A1 | 6/2010 | Lin et al. |
| 2010/0149785 A1 | 6/2010 | Dubuc et al. |
| 2010/0170533 A1 | 7/2010 | Terada et al. |
| 2010/0210079 A1 | 8/2010 | Masuoka et al. |
| 2010/0258144 A1 | 10/2010 | Broz et al. |
| 2010/0294435 A1 | 11/2010 | Maeda et al. |
| 2011/0132396 A1 | 6/2011 | Humphrey |
| 2011/0229675 A1 | 9/2011 | Namikawa et al. |
| 2012/0048298 A1 | 3/2012 | Humphrey et al. |
| 2012/0266461 A1 | 10/2012 | Nickut et al. |
| 2012/0299175 A1 | 11/2012 | Tran |
| 2013/0056025 A1 | 3/2013 | Widhalm |
| 2013/0336689 A1 | 12/2013 | Swing et al. |
| 2013/0336699 A1 | 12/2013 | Vo et al. |
| 2014/0191618 A1 | 7/2014 | Kijima et al. |
| 2014/0251535 A1 | 9/2014 | Ishii et al. |

(56) References Cited

U.S. PATENT DOCUMENTS

| | | |
|---|---|---|
| 2014/0331421 A1 | 11/2014 | Broz et al. |
| 2014/0338698 A1 | 11/2014 | Humphrey et al. |
| 2015/0187617 A1 | 7/2015 | Leung et al. |
| 2015/0191654 A1 | 7/2015 | Wang |
| 2015/0214095 A1 | 7/2015 | Mischitz et al. |
| 2016/0131702 A1 | 5/2016 | Sinsheimer |
| 2017/0010306 A1 | 1/2017 | Na et al. |
| 2017/0203322 A1 | 7/2017 | Ivri et al. |
| 2017/0239695 A1 | 8/2017 | Hamilton |
| 2018/0017748 A1 | 1/2018 | Mir Shafiei |
| 2018/0030821 A1 | 2/2018 | Antonsen et al. |
| 2018/0071798 A1 | 3/2018 | Humphrey et al. |
| 2018/0125284 A1 | 5/2018 | Cave |
| 2018/0308821 A1 | 10/2018 | Humphrey et al. |
| 2019/0262871 A1 | 8/2019 | Stark et al. |
| 2019/0262872 A1 | 8/2019 | Stark et al. |
| 2019/0263613 A1 | 8/2019 | Stark et al. |
| 2019/0263614 A1 | 8/2019 | Stark et al. |
| 2020/0200800 A1 | 6/2020 | Stark et al. |
| 2020/0382583 A1 | 12/2020 | Sahasi et al. |
| 2020/0388590 A1 | 12/2020 | Jindo et al. |
| 2021/0146464 A1 | 5/2021 | Humphrey et al. |
| 2021/0151317 A1 | 5/2021 | Humphrey et al. |

FOREIGN PATENT DOCUMENTS

| | | | |
|---|---|---|---|
| CN | 1717285 | | 1/2006 |
| CN | 1889240 A | * | 1/2007 |
| CN | 101252082 A | | 8/2008 |
| CN | 101339898 A | | 1/2009 |
| CN | 103831676 A | | 6/2014 |
| DE | 20-2004-009619 | | 10/2004 |
| DE | 10-2005-052308 | | 5/2007 |
| EP | 1890326 A2 | | 2/2008 |
| EP | 1942519 A1 | | 7/2008 |
| GB | 2532255 | | 5/2016 |
| JP | S5788742 A | | 6/1982 |
| JP | 2005/8131743 | | 8/1983 |
| JP | S6190434 A | | 5/1986 |
| JP | S6199336 A | | 5/1986 |
| JP | S61124139 A | | 6/1986 |
| JP | S61245536 A | | 10/1986 |
| JP | S63204728 A | | 8/1988 |
| JP | H01276720 A | | 11/1989 |
| JP | H0435778 A | | 2/1992 |
| JP | 2005/211195 | | 8/1993 |
| JP | H0596057 U | | 12/1993 |
| JP | H05326471 A | | 12/1993 |
| JP | H07244074 | | 9/1995 |
| JP | H08264627 A | | 10/1996 |
| JP | H09102453 A | | 4/1997 |
| JP | H09260326 A | | 10/1997 |
| JP | H10154686 A | | 6/1998 |
| JP | 2011/145212 | | 5/1999 |
| JP | 2000/232125 | | 8/2000 |
| JP | 2000/332069 | | 11/2000 |
| JP | 2002248433 A | | 9/2002 |
| JP | 2004063669 A | | 2/2004 |
| JP | 2005/326250 | | 11/2005 |
| JP | 2006/013185 | | 1/2006 |
| JP | 2006015457 A | | 1/2006 |
| JP | 2006019616 A | | 1/2006 |
| JP | 2006/165395 | | 6/2006 |
| JP | 2006/186133 | | 7/2006 |
| JP | 2006216886 A | | 8/2006 |
| JP | 2007002225 A | | 1/2007 |
| JP | 2007035684 A | | 2/2007 |
| JP | 2007157902 A | | 6/2007 |
| JP | 2007329377 A | | 12/2007 |
| JP | 2008047601 A | | 2/2008 |
| JP | 2008/070280 | | 3/2008 |
| JP | 2008066710 A | | 3/2008 |
| JP | 2008/147551 | | 6/2008 |
| JP | 2008/270270 | | 11/2008 |
| JP | 2009138027 A | | 6/2009 |
| JP | 2011/117938 | | 6/2011 |
| JP | 2004/840118 | | 12/2011 |
| JP | 2014/107561 | | 6/2014 |
| JP | 2016531440 A | | 10/2016 |
| JP | 6067951 A | | 1/2017 |
| JP | 6067951 B1 | | 1/2017 |
| KR | 10-2003-92730 | | 7/2003 |
| KR | 20070074398 A | | 7/2007 |
| KR | 20070074426 A | | 7/2007 |
| KR | 10-2008-89297 | | 3/2009 |
| KR | 1020100029504 A | | 3/2010 |
| KR | 10-2011-063275 | | 6/2011 |
| KR | 20140066450 A | | 6/2014 |
| KR | 20170127650 A | | 11/2017 |
| KR | 20180108396 A | | 10/2018 |
| TW | 409322 | | 10/2000 |
| TW | 201115669 A | | 5/2011 |
| WO | 98/47663 | | 10/1998 |
| WO | WO01/08819 A1 | | 2/2001 |
| WO | WO2010030052 A1 | | 3/2010 |
| WO | WO 12/32481 | | 3/2012 |

OTHER PUBLICATIONS

International Test Solutions, Probe Clean™ on Silicon Wafer Publication, dated May 2002 (2 pgs.).

International Test Solutions Publication, Probe Clean™ for Use on Prober Abrasion Plates, dated May 2002 (2 pgs.).

International Test Solutions Publication, Probe Clean™ Non-Abrasive Method to Clean Loose Debris from Probe Tips, dated May 2002 (1 pg.).

International Test Solutions Publication, Probe Polish™ on Silicon Wafer, dated May 2002 (2 pgs.).

International Test Solutions Publication, Probe Polish™ for Use on Prober Abrasion Plates, dated May 2002 (2 pgs.).

International Test Solutions Publication, Probe Scrub™ Restore Probe Tip Performance and Remove Bonded Debris, dated May 2002 (1 pg.).

International Test Solutions, Probe Form™ Publication, dated Jul. 7, 2005 (2 pgs.).

International Test Solutions, Cleaning Parameters for TEL Probers P8 and P8-XL Publication, dated printout dated Sep. 18, 2003 http://web.archive.org/web/20030918014522/http://inttest.net/products/PC2002.pdf (3 pgs.).

Anonymous: "Wire Bonding"—Wikipedia—Retrieved from the Internet https://en.wikipedia.org/wiki/Wire_bonding\ (2 pgs).

Neware, Pallawi, B., et al, "Flexible Organic Light Emitting Diodes-FOLED," Oct. 26, 2015, vol. 5, No. 5, pp. 3457-3462.

Zhao, L., et al., "Novel Method for Fabricating Flexible Active Matrix Organiz Light Emitting Diode (AMOLED) Displays," Sep. 21, 2011, (5 pp.).

Margaret Rouse, Definition "end effector" from WhatIs.com, Feb. 26, 2009, retrieved on Nov. 7, 2019, 2 pages. https://whatis.techtarget.com/definition/end-effector?vgnextfmt=print.

Istvan Benedek and Luc J. Heymans, "Pressure-Sensitive Adhesives Technology", 1997, Marcel Dekker, Inc., Chapter 6, pp. 186-187. (Year: 1997).

American Society for Testing And Materials, Standard Test Methods of Liner Removal at High Speeds from Pressure-Sensitive Label Stock, Designation: D5375/D5375M-98, current edition approved Apr. 10, 1998, Annual Book of ASTM Standards, vol. 14.02., 3 pages.

ASTM International, Standard Terminology of Adhesives, Designation: D907-15, current edition approved Sep. 15, 2015, 13 pages.

ASTM International, Standard Test Method for Loop Track, Designation: D6195-03, current edition approved Apr. 1, 2011, 5 pages.

ASTM International, Standard Test Method for Pressure-Sensitive Tack of Adhesives Using an Inverted Probe Machine, Designation: D2979-16, current edition approved Oct. 1, 2016, 3 pages.

Intellectual Property Office of Singapore, Invitation to Respond to Written Opinion and Search Report issued in connection with Application No. 11202007923Q dated Oct. 25, 2021.

Intellectual Property Office of Taiwan, Search Report issued in connection with Application No. 110116264 dated Nov. 29, 2021.

(56) References Cited

OTHER PUBLICATIONS

European Patent Office, Extended European Search Report issued in connection with Application No. 19758051.7 dated Oct. 26, 2021.
Intellectual Property Office of Taiwan, Search Report issued in connection with Application No. 109119730 dated Feb. 10, 2022.
Japanese Patent Office, Notice of Reasons for Rejection issued in connection with Application No. 2019-557810 dated Dec. 6, 2021.
First Office Action, China, 202080057369.X, dated Feb. 8, 2023.

* cited by examiner

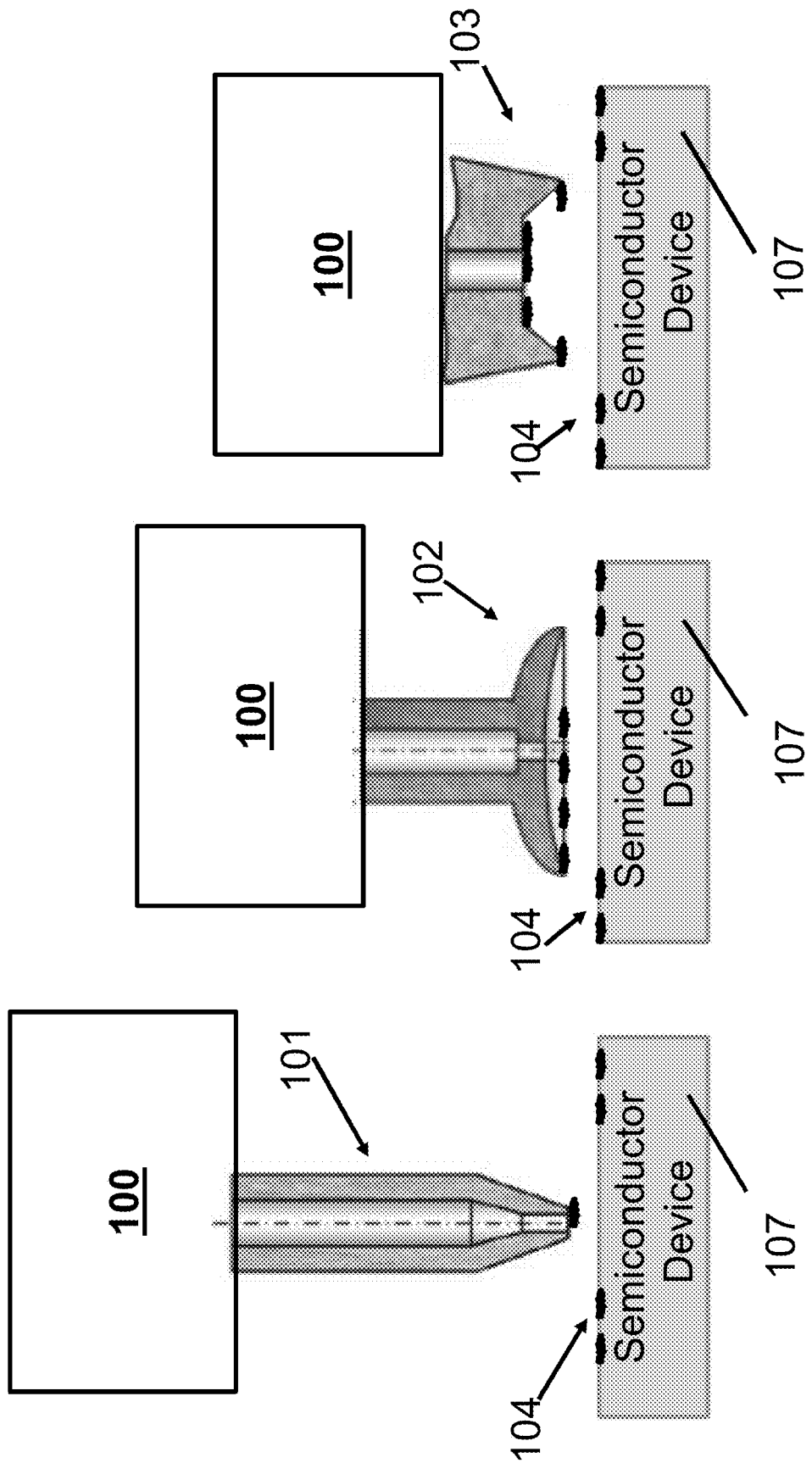

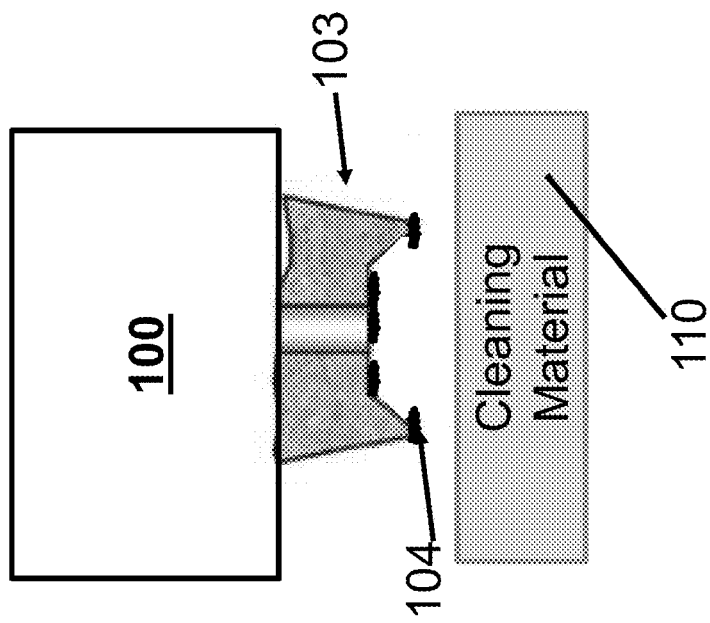
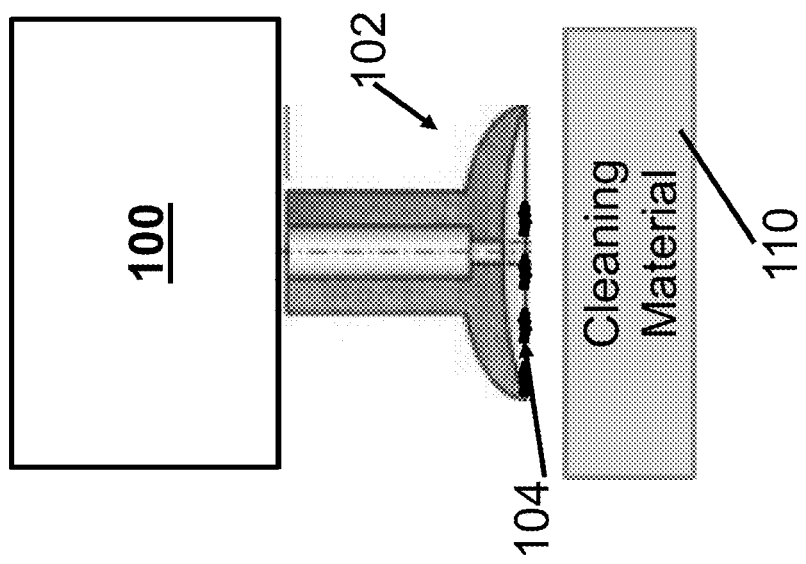
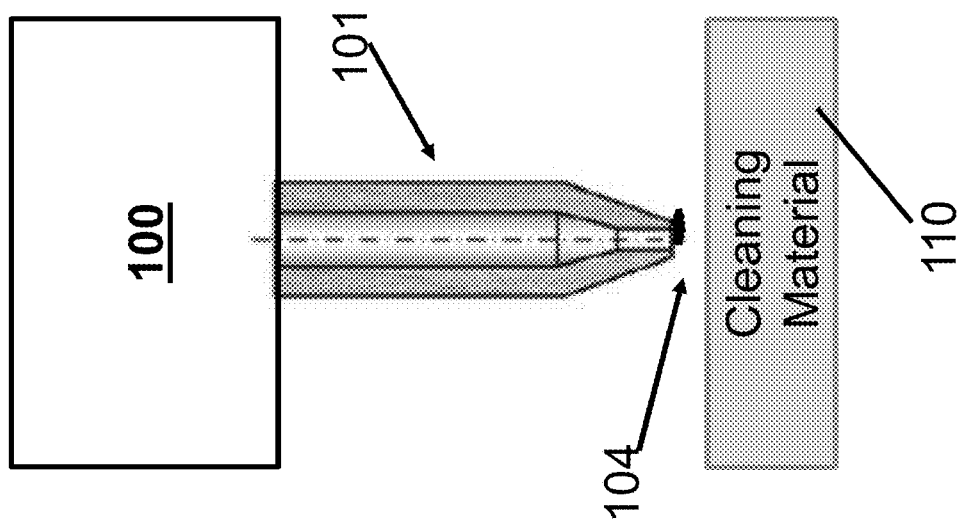

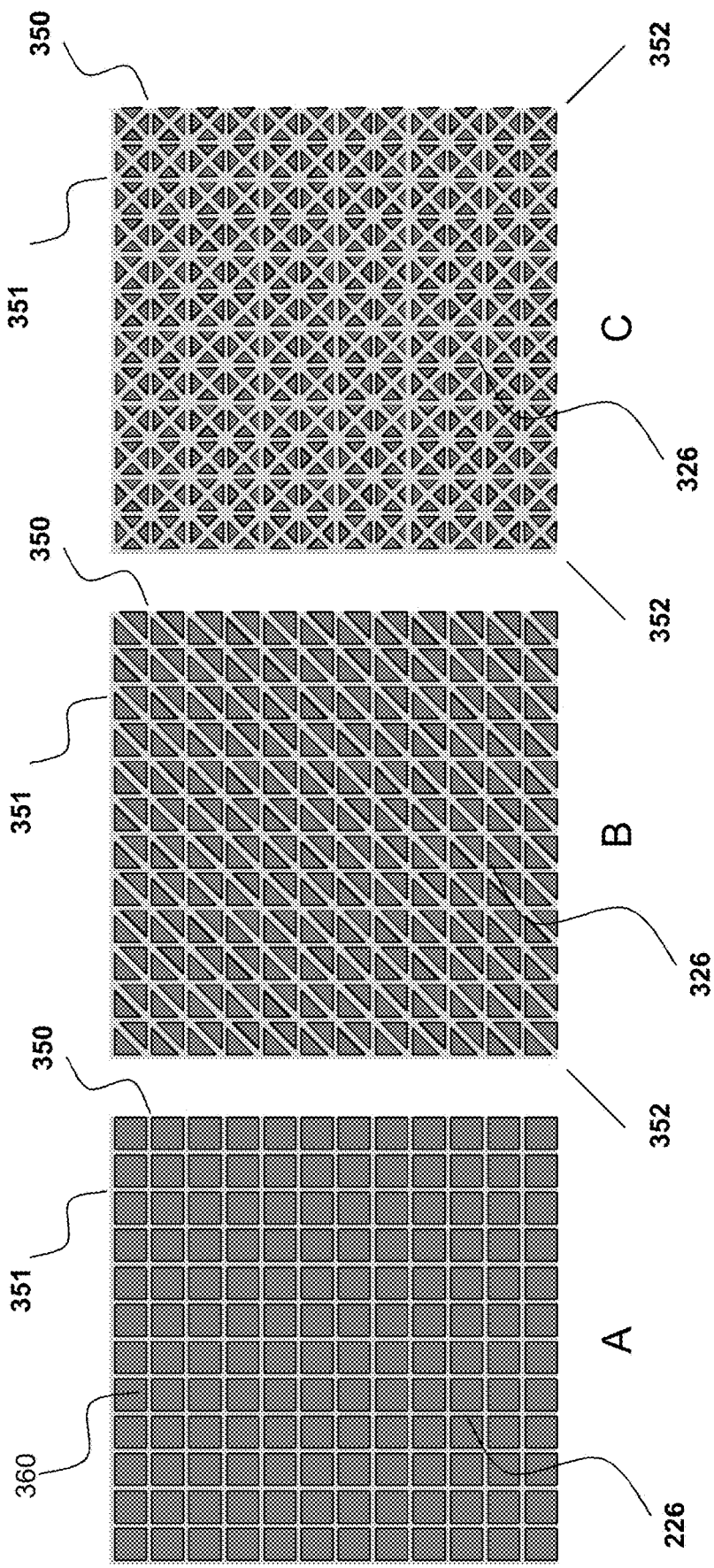

PICK AND PLACE MACHINE CLEANING SYSTEM AND METHOD

FIELD

The disclosure is particularly applicable to a device, mechanism, and method for regular and consistent cleaning of the aperture, nozzle, and contacting surfaces of a pick-and-place apparatus and the pick-up tools of automated or manual semiconductor device and die handling machines and it is in this context that the disclosure will be described. The cleaning material may include a cleaning pad layer with one or more intermediate layers that have predetermined characteristics, regular geometrical features, and/or an irregular surface morphology.

BACKGROUND

Pick-and-place apparatus are used within robotic machines which are used to transfer semiconductor devices, die, or electronic components from one holding tray to another, transfer semiconductor devices or die from one holding tray or wafer tape to a lead-frame for die attach, from one holding tray to a test socket for electrical test and back to the holding tray, or for electronic component from a holding tray for mounting onto a printed circuit board. These apparatuses are used for high speed, high precision picking-up, and placing of broad range of semiconductor devices and die. Downtime of this equipment for unscheduled maintenance will have significant impact for productivity and throughput loss.

A pick-and-place apparatus includes a plurality of suction cups, suction inlets, vacuum collets, nozzles, and vacuum pick-up tools for picking up, via vacuum force, semiconductor devices from a device holding tray. The suction of the vacuum force is created by a vacuum mechanism that has an up-and-down movement for picking up the electronic devices from the one holding tray and placing the device into a test socket, lead-frame, or another other holding tray or onto a printed circuit board in a pre-defined location. Mishandling due to vacuum faults can cause damage to the devices and can require troubleshooting to recover performance. Furthermore, vacuum related issues and excessive downward pressing force of the pickup collet are the major factors for die breakage.

To maintain proper suction and reliably pick and place a semiconductor device, a contact seal between the pick-and-place apparatus and the semiconductor device being handled is required. Debris within the vacuum aperture, device vacuum nozzle, vacuum inlet/outlet or on the contact surface of the suction device will affect the vacuum strength. Over time, the aperture of the pick-and-place apparatus, pick-up tools, and the suctions devices and tips can become clogged or contaminated with various materials that reduce the vacuum strength and could cause vacuum faults. To clean and maintain the pick-and-place apparatus, the IC device handling machines must be taken off-line, and the various pick-and-place apparatus are manually cleaned. During the off-line cleaning operation, it can be difficult to clean or remove materials that have accumulated within the nozzles of the pick-up tools or might have been compacted within the nozzle or on the surface. Routine, preventative cleaning and debris removal can be effective for controlling the accumulation and preventing the build-up of tenacious contamination. Regular preventative cleaning and debris removal will extend the mean-time-before-maintenance and improve equipment uptime.

Cleaning of the pick-and-place apparatus is performed by removing the vacuum pick-up tools or the suction pick-up tool from the equipment to be cleaned and/or refurbished. The cleaning and refurbishing of the pick-and-place apparatus consists of a wet-wipe-down and scrubbing process using solvents or other cleaning solutions. Additionally, the vacuum port of the pick-up tool might be cleared manually using a mechanical operation to remove accumulated debris. However, manual handling and cleaning of the pickup tools poses a risk for damage.

This typical cleaning process for the pick-and-place apparatus and the vacuum pick-up requires the semiconductor device handling function to be stopped while the pick-and-place assembly is being cleaned and refurbished. Furthermore, the wet chemical process and mechanical scrubbing process can damage the vacuum pick-up tool. To maximize performance and maintain up-time for high throughput, is desirable to be able to clean the pick-and-place assembly of a semiconductor device handling machine without removing the pick-and-place apparatus, the vacuum pick-up tool, or the suction pick-up tool and without using a wet chemical process or a mechanical scrubbing process.

BRIEF DESCRIPTION OF THE DRAWINGS

Some embodiments are illustrated as an example and are not limited by the figures of the accompanying drawings, in which like references may indicate similar elements and in which:

FIGS. 2A, 2B, and 2C illustrates tools used in manual, semi-automated, or automated semiconductor device handling machine with a pick-and-place assembly in which various contamination and debris from surface of the "pick-up" side of the semiconductor device have adhered or attached to the vacuum and suction pickup tools used for "picking-up" the semiconductor device;

FIGS. 3A, 3B, and 3C illustrates tools used in manual, semi-automated, or automated semiconductor handling machine with a pick-and-place assembly during a cleaning operation in which the various pick-up tool types are moved in contact with the surface of the elastomeric cleaning material;

FIG. 10A is a plan view of a sixth embodiment of the cleaning material that shows a portion of mutually decoupled micro-features using an array of "streets" for resultant second moment of area or inertia to control the resistance to bending;

FIG. 10B is a plan view of a seventh embodiment of the cleaning material that shows portion of mutually decoupled micro-features using an array of "avenues" for resultant second moment of area or inertia to control the resistance to bending;

FIG. 10C is a plan view of an eighth embodiment of the cleaning material that shows portion of mutually decoupled micro-features using an array of diagonals for second moment of area or inertia to control the resistance to bending;

DETAILED DESCRIPTION OF ONE OR MORE EMBODIMENTS

This disclosure particularly applicable to a device, mechanism, and method for regular and consistent cleaning of the aperture, nozzle, and contacting surfaces of a pick-and-place apparatus and the pick-up tools of automated or manual semiconductor device handling machines and it is in this context that the disclosure will be described. It will be appreciated, however, that the device, mechanism and method has greater utility since it may be used to clean any device that has an aperture, nozzle, and contacting surfaces that become clogged or dirty over time with various materials, it can also be used to clean or refurbish other pick-up tools of automated or manual semiconductor device handling machines and the device, mechanism and method may be implemented using variations of the embodiments disclosed below that are still within the scope of the disclosure. For example, the below disclosed cleaning device and method may be used to clean a pick-and-place apparatus of a SMT (surface mount technology) component placement machine used for placing of broad range of electronic components, like capacitors, resistors, integrated circuits onto the PCBs. Furthermore, the cleaning material used for the above cleaning may be below described embodiments, but may also be other variations of the cleaning device that would be within the scope of the disclosure.

Figure 14B:
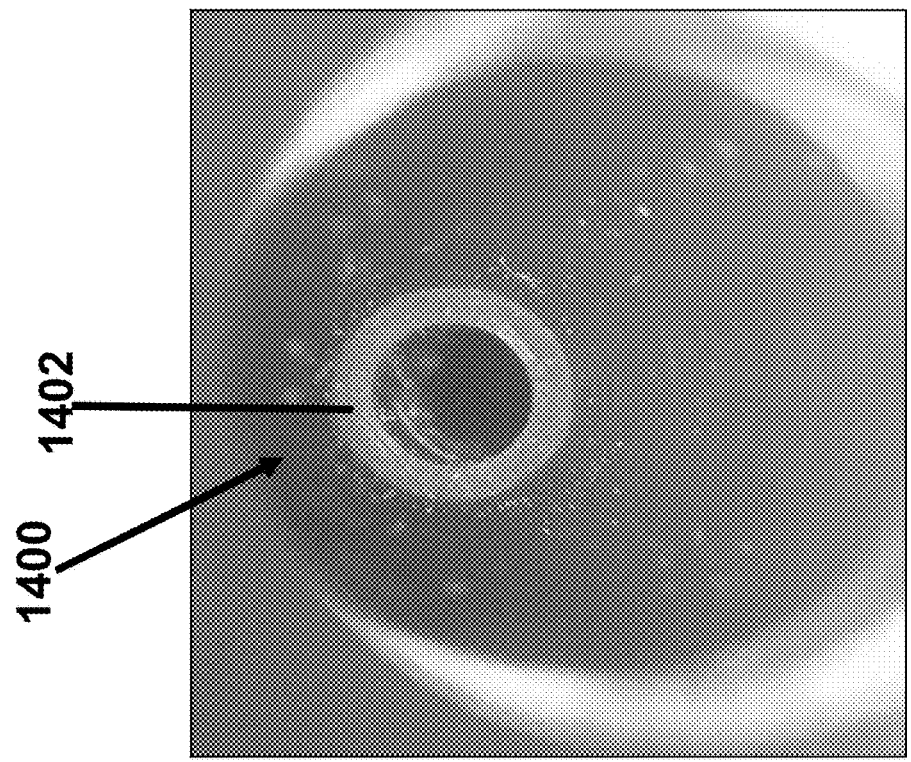
FIG. 14B is an example of the vacuum collet after cleaning using the cleaning device.
Figure 14A:
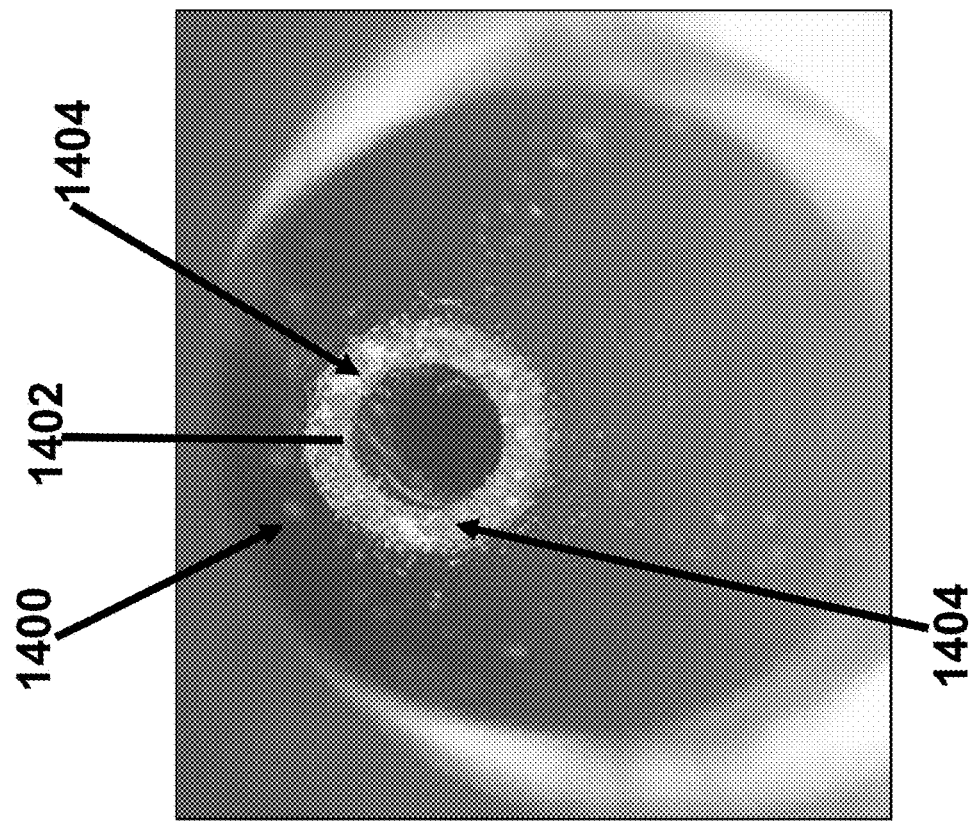
FIG. 14A is an example of a vacuum collet before cleaning using the cleaning device.

In one example use, the pick-and-place apparatus, the vacuum pick-up tool, or the suction pick-up tool may be periodically cleaned with tacky elastomeric cleaning materials (generally the cleaning material in the various embodiments described below) installed onto a surrogate device, various substrates, in a designated location in the tool, or in-tool carriers that can be used to predictably clean and maintain the performance of the vacuum apertures as well as maintain the required cleanliness of the contact surface for maximum vacuum force during pick-up. A contact portion of the tool/machine (pick-up tool or pick and place apparatus or a pick and place apparatus for SMT components or a pick and place for packaged devices) that contacts the component/device/IC, etc. being handled may be cleaned using the cleaning material in which the contact element/portion may be, for example, one or more vacuum apertures, one or more nozzles, one or more suction cups, one or more suction inlets, one or more vacuum collets, and vacuum pick-up tools connected to semiconductor device handling machines. In addition to the above pick and place apparatus, the cleaning device and method may also be used for pick-and-place assembly of die attach machines or flip-chip bonder machines. The cleaning material, device, mechanism, and method can be used to refurbish the pick-and-place apparatus within manual, semi-automated, and automated semiconductor device handling machines without requiring unscheduled down-time for maintenance. An example of a vacuum collet before cleaning with debris on the collet contact surfaces is shown in FIG. 14A and described below and an example of the same vacuum collet after cleaning using the disclosed cleaning device is shown in FIG. 14B and described below.

Figure 1A:
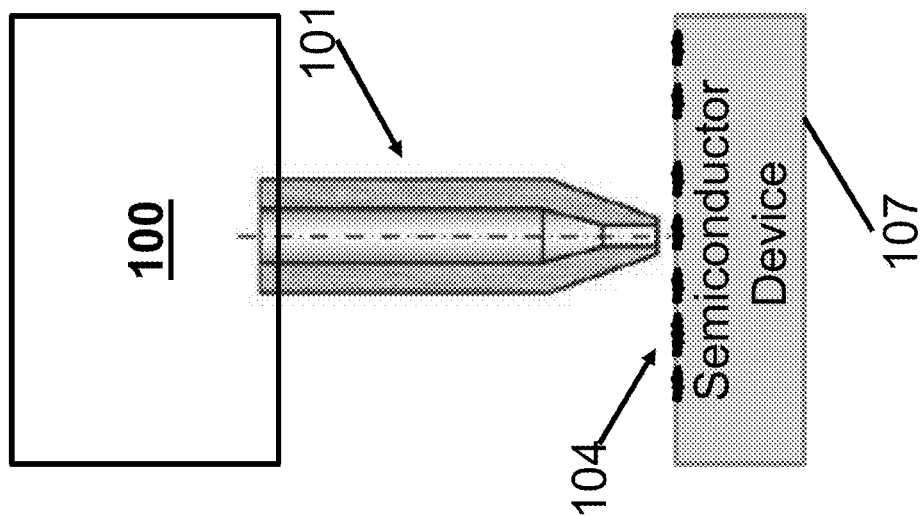
FIGS. 1A, 1B, and 1C illustrate tools used in manual, semi-automated, or automated semiconductor device handling machines with a pick-and-place assembly that utilizes a vacuum and suction pickup tools for "picking-up" a semiconductor device that has various contamination and debris on surface of the "pick-up" side of the semiconductor device.
Figure 1B:
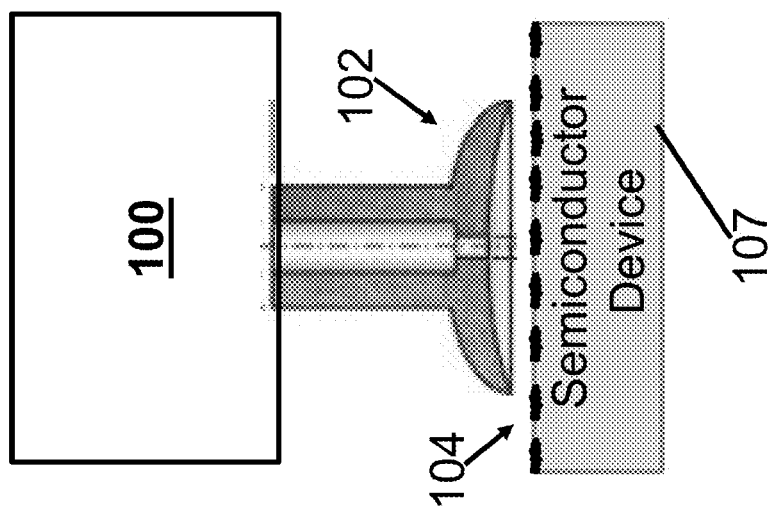
Figure 1C:
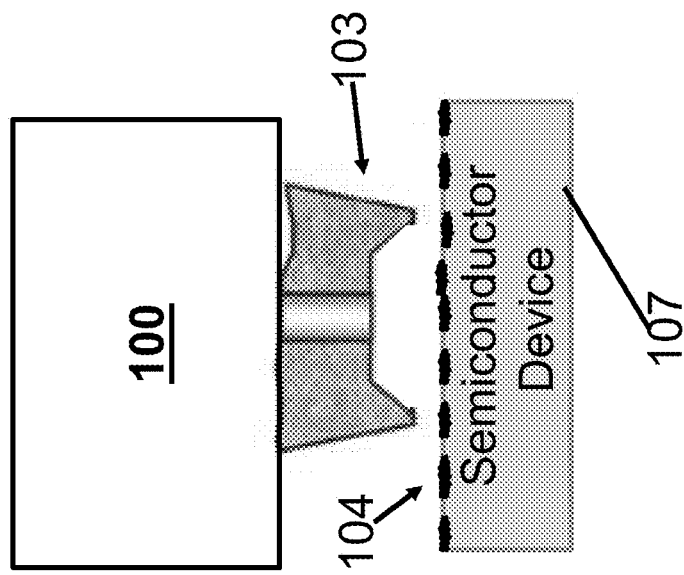

FIGS. 1A-C illustrate a known automated or manual semiconductor device handling machine (100) having different types of pickup tools (101, 102, and 103) being used for "picking-up" a surface mounted device (107), such as an electronics device or a semiconductor devices.

FIG. 1A shows a portion of that machine 100 and particularly shows a conical vacuum pickup tool (101) part of the machine that has an inlet/outlet positioned close to the semiconductor device (107) to pickup and place the semiconductor device (107), FIG. 1B shows a suction cup pickup tool (102) with a flexible pad and inlet/outlet positioned close to the semiconductor device (107) to pickup and place the semiconductor device (107) and FIG. 1C shows a multi-sided vacuum collet pickup tool (103) with an inlet/outlet positioned close to the semiconductor device (107) to pickup and place the semiconductor device (107). The vacuum pickup tools (101, 102, and 103) are removably attached to the semiconductor device handling machine so that the pickup tool may be periodically removed for cleaning and/or refurbishing. The vacuum pickup tools (101, 102, and 103) are lowered towards a semiconductor device 107 until contact is made and vacuum can be applied to a surface of the device. The contact surface of the pickup tool also makes contact and vacuums any debris, particles, or contamination (104) (collectively "debris") that are present on the surface of the semiconductor device as represented for illustration purposes with the black dashes along the surface of the semiconductor device since the actual debris, particles, or contamination may be of any shape or size and made of various different materials. For example, the debris on the devices that are pick-and-placed could be metallic-flakes, mold-compound fragments, solder residuals, leftover solder flux, particles from other devices, dust created during handling, etc.

FIGS. 2A-C illustrate a known automated or manual semiconductor device handling machine (100) having different types of pickup tools (101, 102, and 103) after picking-and-placing the semiconductor devices into a pre-defined location. When the semiconductor device (107) is picked up by the tool 101,102, 103, debris, particles, or contamination (104) from the semiconductor device (107) are adherent to the contact surface and the inlet/outlet of the different pickup tools (101, 102, and 103) as shown in the figures. For example, FIG. 2A shows a conical vacuum pickup tool (101) with debris closing the vacuum inlet/outlet, FIG. 2B shows a suction cup pickup tool (102) with debris adhering to the flexible pad and clogging the vacuum inlet/outlet and FIG. 2C shows a multi-sided vacuum collet pickup tool (103) with debris inside and outside the collet as well as clogging the vacuum inlet/outlet. The adherent debris, particles, or contamination (104) will reduce the amount suction available for the vacuum mechanism to repeatable, consistently and repeatedly pick up the devices (107) from a location and placing the devices in a second pre-defined location without dropping or mishandling the devices. Excessive downward pressing forces of the pickup tools 101-103 (caused by reduced suction due to the adherent debris, particles, or contamination (104) in which the pickup tool may press down harder to achieve that desired suction) are a well-known and major factor for die breakage.

Figure 4A:
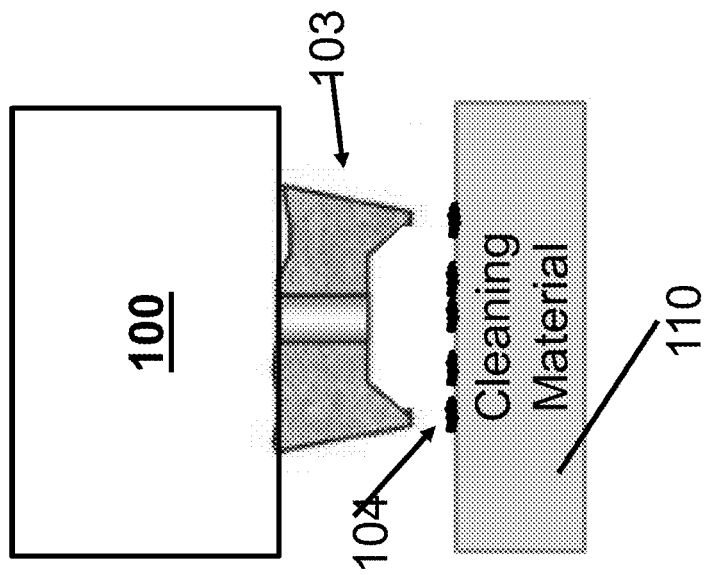
FIGS. 4A, 4B, and 4C illustrates a method for cleaning and removing adherent debris and contamination from the various vacuum and suction pickup tools used in manual, semi-automated, or automated semiconductor device handling machine with a pick-and-place assembly.
Figure 4B:
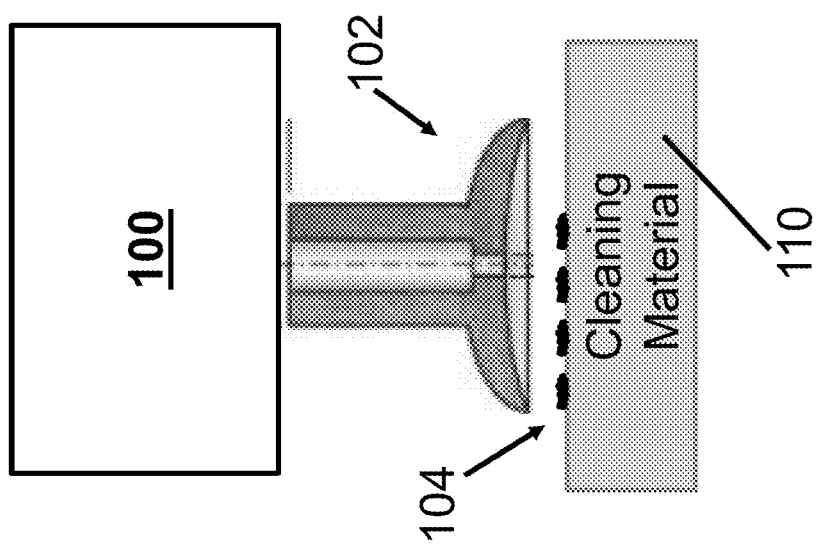
Figure 4C:
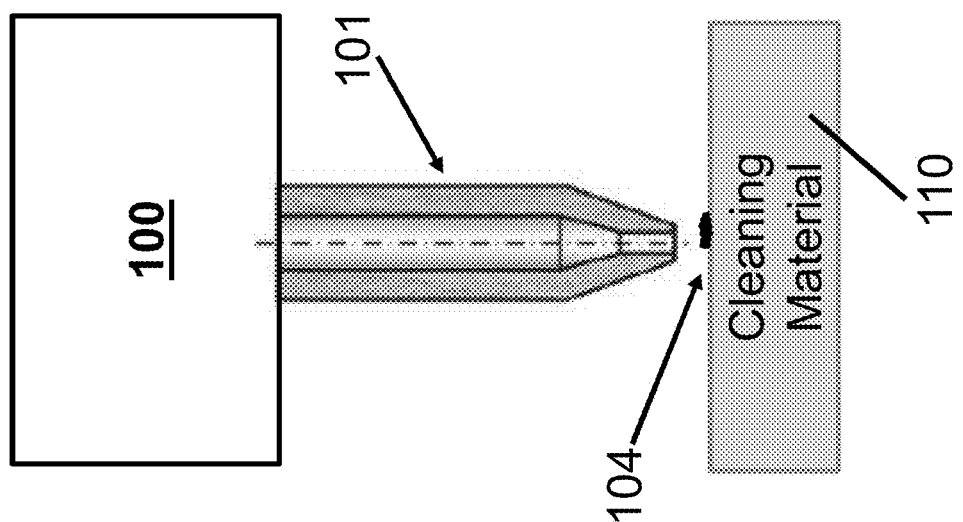

FIG. 3 and FIG. 4 illustrate a first embodiment of a method for cleaning the contact surface and the inlet/outlet of the different pickup tools (101 in FIGS. 3A and 4A, 102 in FIGS. 3B and 4B, and 103 in FIGS. 3C and 4C). The different pickup tools (101, 102, and 103) with adherent contamination (104), using the novel cleaning method, do not need to be removed from the vacuum mechanism in contrast to the typical cleaning methods. A cleaning material (110) may be installed onto a cleaning substrate, a surrogate package, or onto a clean block or station at a predefined position. The cleaning process can be performed in different ways that may include manually by a human being positioning the cleaning material (110) adjacent the contact surface and the inlet/outlet of the pickup tools (101, 102, and 103); semi-automatically in which a human instructs the handling machine to position the pickup tools (101, 102, and 103) near the cleaning material (110); or automatically in which the handling machine move and positions the cleaning material or the cleaning surrogate (104) under the pickup tools (101, 102, and 103) when a cleaning is needed or on a periodic cleaning cycle. When the cleaning method is initiated manually, semi-automatically or automatically, the machine moves the pickup tools and the pickup tools are inserted into the cleaning material or brought into contact with the surrogate cleaning device. FIG. 4 illustrates how the debris, particles, or contamination (104) are captured and removed by the cleaning material (110). In some embodiments, pick up errors of the machine may be detected and the cleaning process may be initiated. The cleaning frequency could be a preventive maintenance in order to extend the mean time between manually cleaning execution as well as reduce the need to take the unit off-line.

Figure 5:
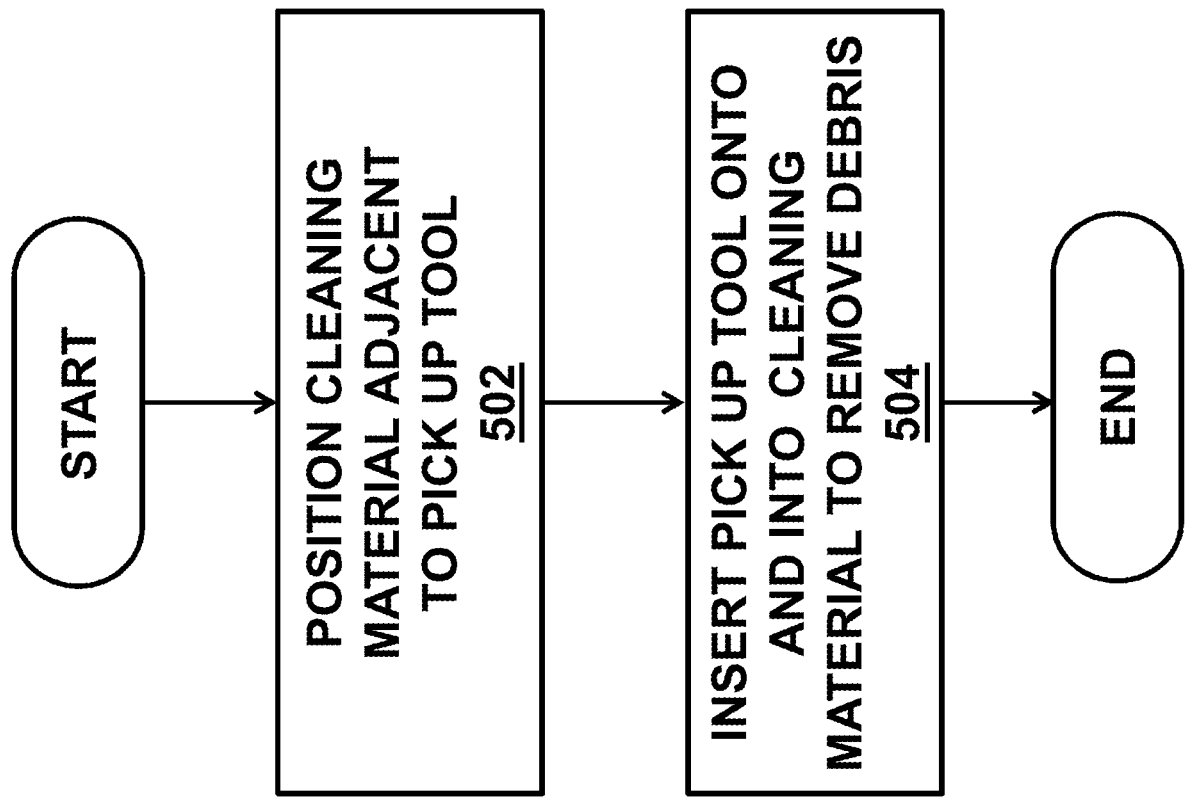
FIG. 5 illustrates an example of a method for cleaning the various vacuum and suction pickup tools used in manual, semi-automated, or automated semiconductor device handling machine with a pick-and-place assembly.

FIG. 5 illustrates a cleaning process 500 that may be performed on the pick-and-place apparatus, the vacuum pick-up tool, or the suction pick-up tool. The process shown in FIG. 5 may be performed manually, semi-automatically or automatically as described above. The process 500 may be performed in-situ at regular intervals to keep the pickup tools contact surfaces clean; regularly collect debris, particles, or contamination; and maintain the suction levels to prevent dropping or mishandling the devices that would result in downtime or equipment errors. As shown in FIG. 5, the process may include a cleaning material being positioned adjacent to the tool (502) when the cleaning process is to be performed. The cleaning method may then cause the tool to be inserted onto and into the cleaning material to remove debris (504). In one embodiment, the cleaning material may be used to perform a cleaning between periods of normal operation of the machine.

The cleaning material used for cleaning the pick-and-place apparatus, the vacuum pick-up tool, or the suction pick-up tool may take various forms. For example, the cleaning material may have a cross linked polymer layer, may have a cleaning layer on top of a carrier or substrate or frame so that the cleaning material may be handled in the same way as the semiconductor device, may have a cleaning layer and one or more intermediate layers underneath the cleaning layer, etc. The cleaning material may also have a textured, featured, or irregular surface or a pattern which would be advantageous to cleaning inside and outside of the pickup tools. The cleaning material may be such that it retains debris from the pickup tool and vacuum inlet/outlet when the pickup tool is inserted into the cleaning material. The cleaning material may preferably include a compliant polymer with embedded abrasive particles such as Probe Polish or a lapping film such as Probe Lap that are commercial products manufactured by International Test Solutions, Inc.

Figure 6A:
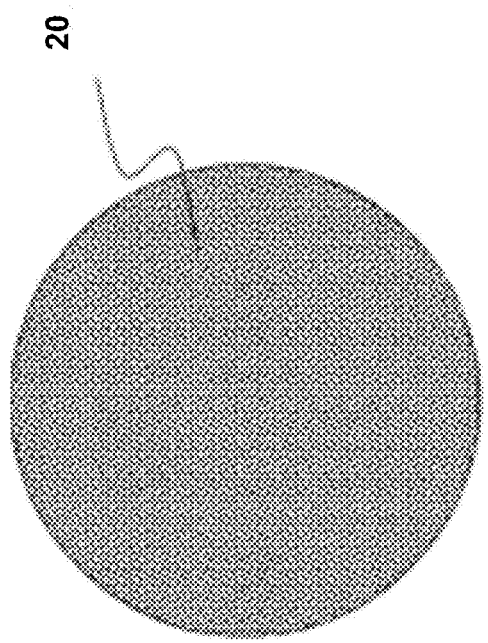
FIG. 6A a top view of a cleaning device with cleaning pad applied to a carrier for use within manual, semi-automated, or automated semiconductor device handling machine.
Figure 6B:
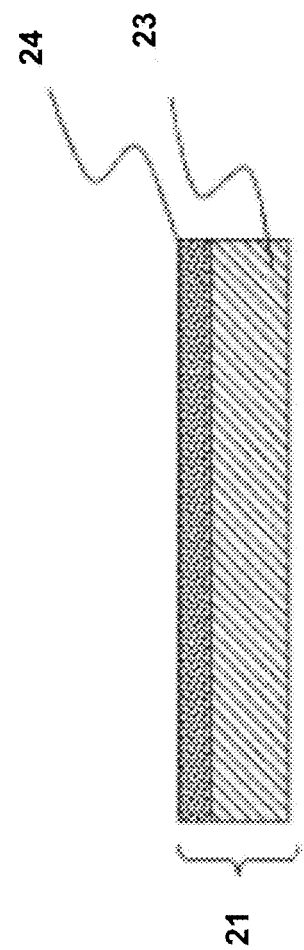
FIG. 6B is a sectional view of a typical cleaning device with cleaning pad applied to a substrate surface for use within the manual, semi-automated, or automated semiconductor device handling machine.
Figure 6C:
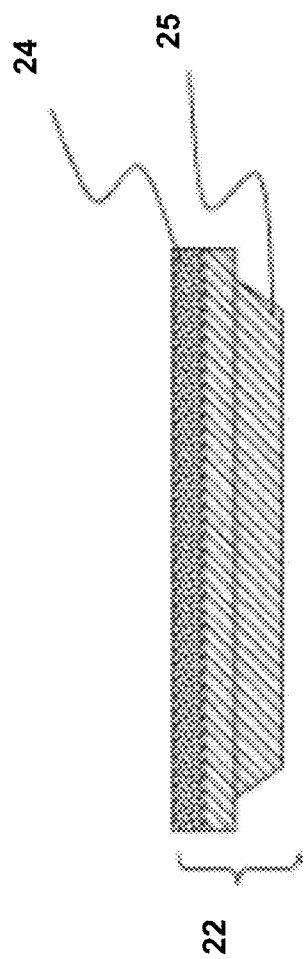
FIG. 6C is a sectional view of a typical cleaning device with a cleaning pad applied to an IC package or semiconductor device for use within manual, semi-automated, or automated semiconductor device handling machine.

FIGS. 6A, 6B, and 6C illustrate three typical different types of cleaning devices manufactured with a cleaning material applied to various substrate materials, different size substrates, different shape substrates or without a substrate in some applications. As shown in FIGS. 6A and 6B, cleaning device 20 and 21, respectively, may include a substrate 23 and a cleaning medium material, or pad, 24 secured, adhered, or applied to a surface of a carrier or to substrate of known geometry, respectively. The substrate 23 may be plastic, metal, glass, silicon, ceramic or any other similar material. Furthermore, a substrate 25 shown in FIG. 6C may have a geometry that approximates the geometry of the packaged IC device (DUT) 22. No one is known to have used these cleaning devices with the cleaning material to clean the pickup tool contact surface, sides, and vacuum inlet/outlet or done so during the normal operation of the machine and without removing pickup tool contact surface, sides, and vacuum inlet/outlet from the machine during the cleaning operation.

The pickup tool contact surface, sides, and vacuum inlet/outlet cleaning process and device may use a cleaning medium with one or more intermediate complaint layers as is described in more detail with reference to the accompanying drawings and embodiments. In one embodiment (shown in FIG. 7A), a cleaning medium 220 may be made from a cleaning pad layer 202 of predetermined properties, such as hardness, elastic modulus, etc., that contribute to the cleaning of the pickup tool contact surface, sides, and vacuum inlet/outlet that contact the bond pad or frame. The cleaning medium 220 may also have one or more intermediate compliant layers 203 attached to and below the cleaning pad layer. The combinations of layers produce material properties unavailable from the individual constituent materials, while the wide variety of matrix, abrasive particles, and geometries allows for a product or structure with an optimum combination to maximize cleaning performance. By adding compliant or microporous foam underlayers beneath a rigid cleaning layer, the overall characteristics of the cleaning material are enhanced in order to extend the overall service life of the pickup tool contact surface, sides, and vacuum inlet/outlet without compromising the shape or function. Application of an abrasive particle layer to the surface of a compliant unfilled polymer or the "skin" side of a microporous foam, results in multi-layered material with preferential abrasive characteristics. As the overall compliance of the underlayer(s) is systematically increased (or rigidity is decreased), the overall characteristics of the cleaning material can be defined.

Figure 7A:
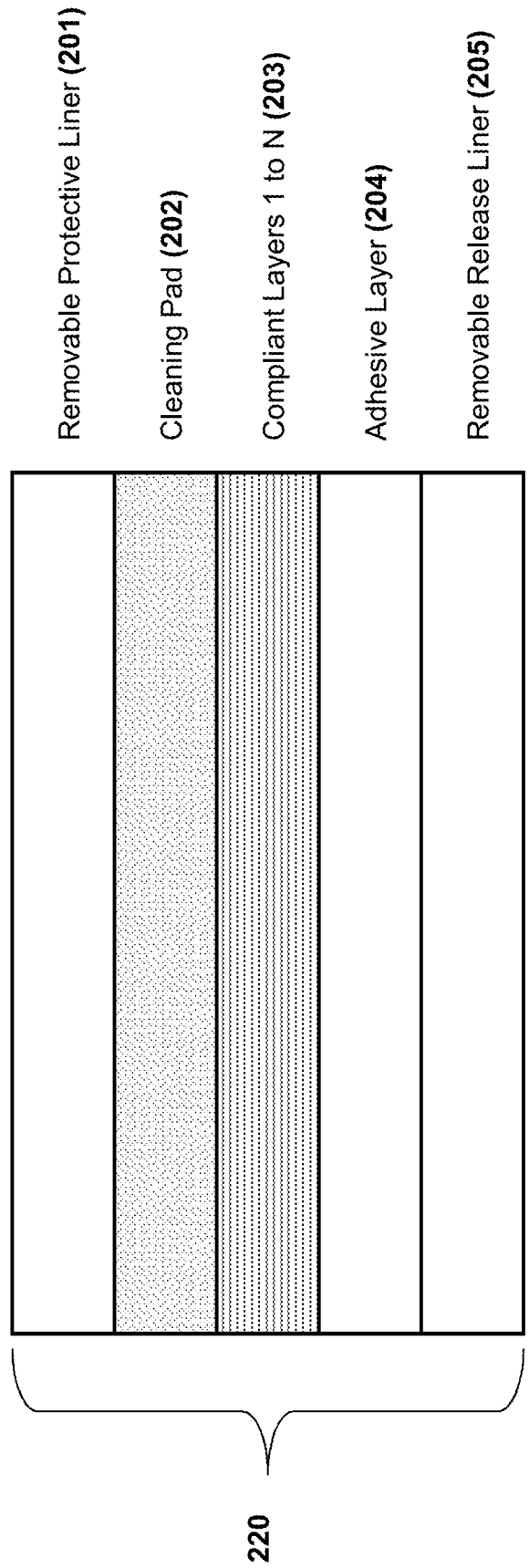
FIG. 7A is a sectional view of a second embodiment of the cleaning medium that has one or more intermediate complaint material layers below a cleaning pad layer.

In one embodiment shown in FIG. 7A, the cleaning medium 220 may also have a removable protective layer 201 that is installed on top of the cleaning pad 202 layer prior to the intended usage in order to isolate the surface cleaning pad layer from contaminants. The removable protective layer 201 protects the working surface of the cleaning pad layer 202 from debris/contaminants until the cleaning device is ready to be used for cleaning pickup tool contact surface, sides, and vacuum inlet/outlet. When the cleaning device is ready to be used for cleaning the pickup tool contact surface, sides, and vacuum inlet/outlet, the removable protective layer 201 may be removed to expose the working surface of the cleaning pad layer 202. The protective layer may be made of a known non-reactive polymeric film material and preferably made of a polyester (PET) film. The protective layer may have a matte finish or other "textured" features to improve the cleaning efficiency. The matte or featured surface also may be helpful to identify the cleaning surface. The surface would be "functional" and these "function features" would facilitate the cleaning performance of the various nozzles and collets. These functional features could be inserted into the interior of the vacuum nozzles for cleaning and debris collection within the vacuum channels.

The cleaning medium 220, in addition to the one or more complaint layers 203, may have an adhesive layer 204 underneath the one or more compliant layers 203 and a removable release layer 205 that is on top of the adhesive layer 204 as shown in FIG. 7A. The installation of the cleaning device 220 onto the predetermined substrate material (for cleaning of the tools) is performed by removal the second release liner layer 205 (made of the same material as the first release liner layer) to expose the adhesive layer 204, followed by application onto the substrate surface by the adhesive layer 204. The adhesive layer 204 may then be placed against a substrate adhere the cleaning device 220 to the substrate. The substrate may be a variety of different materials as described in the prior art which have different purposes.

The cleaning pad layer 202 described above and the cleaning pad layers described below may provide predetermined mechanical, material, and dimensional characteristics to the cleaning material. For example, the cleaning pad layer may provide abrasiveness, a specific gravity (of a range of 0.75 to 2.27 for example) wherein specific gravity is the ratio of the density to the density of water at a particular temperature, elasticity (of a range of 40-MPa to 600-MPa for example), tackiness (of a range of 20 to 800 grams for example), planarity, and thickness (a range between 25-um and 500-um for example).

The one or more intermediate layers 203 (which can be compliant as described above, rigid as described below or a combination of compliant and rigid layers as described below) may provide predetermined mechanical, material, and dimensional characteristics to the cleaning material. For example, the one or more intermediate layers may provide abrasiveness (described in more detail below), a specific gravity (of a range of 0.75 to 2.27 for example) wherein specific gravity is the ratio of the density of the one or more intermediate layers to the density of water at a particular temperature, elasticity (of a range of 40-MPa to 600-MPa for example), tackiness (of a range of 20 to 800 grams for example), planarity, thickness (a range between 25-um and 500-um for example), and/or porosity (a range of 10 to 150 micropores per inch for example) which is an average number of pores per inch.

Figure 7B:
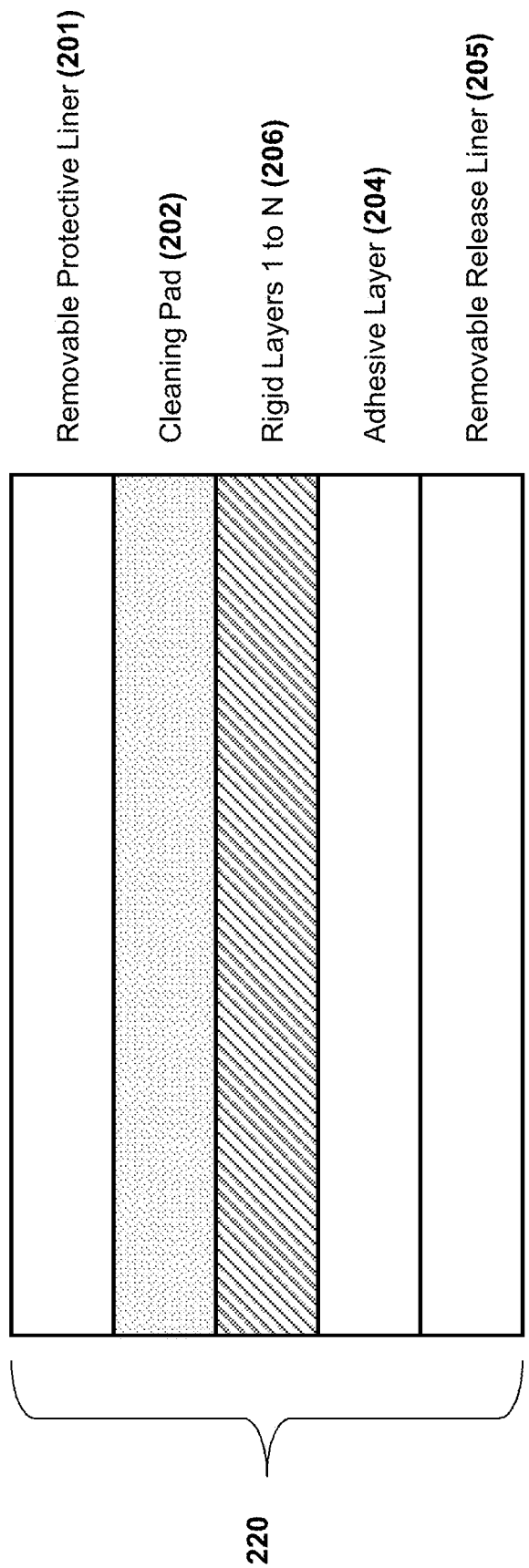
FIG. 7B is a sectional view of the second embodiment of the cleaning medium with one or more intermediate rigid material layers below a cleaning pad layer of predetermined properties.
Figure 7C:
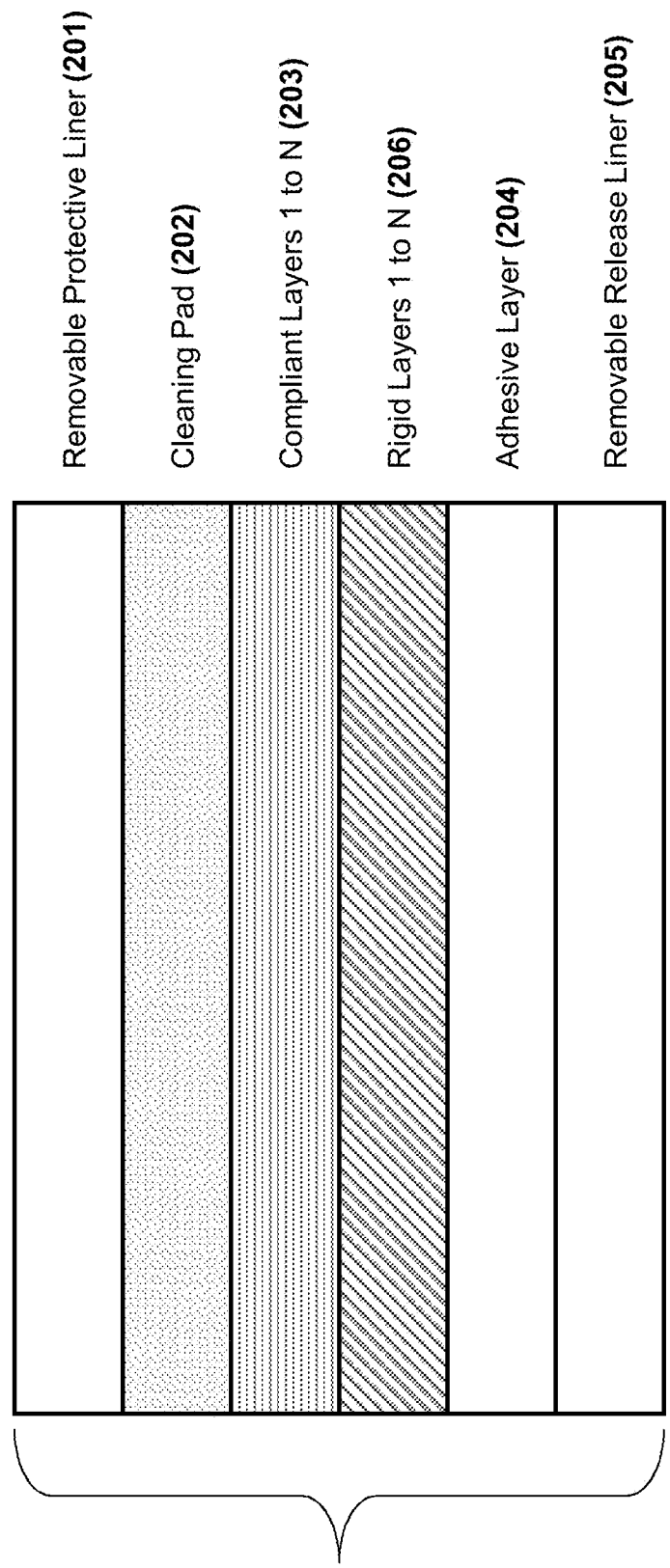
FIG. 7C is a sectional view of the second embodiment of the cleaning medium that has one or more intermediate rigid and compliant material layers beneath a cleaning pad layer of predetermined properties.

In another embodiment shown in FIG. 7B, the cleaning medium 220 may be made from a cleaning pad layer 202 with one or more intermediate rigid layers 206 below the cleaning pad layer 202 the support the cleaning pad layer 202. For another embodiment (FIG. 7C), the cleaning medium 220 may be constructed using a combination of one or more intermediate rigid layers 206 and one or more compliant 203 material layers beneath a cleaning pad layer 202 of predetermined properties. Note that while the embodiment in FIG. 7C has the one or more compliant layers 203 between the cleaning pad 202 and the one or more rigid layers 206, an embodiment may instead have the one or more rigid layers directly underneath the cleaning pad layer 202 and the one or more compliant layers underneath the rigid layers 206. Note also that the embodiments in FIGS. 7B And 7C also have the two protective liner layers 201, 205 and the adhesive layer 204 as described above.

Figure 7D:
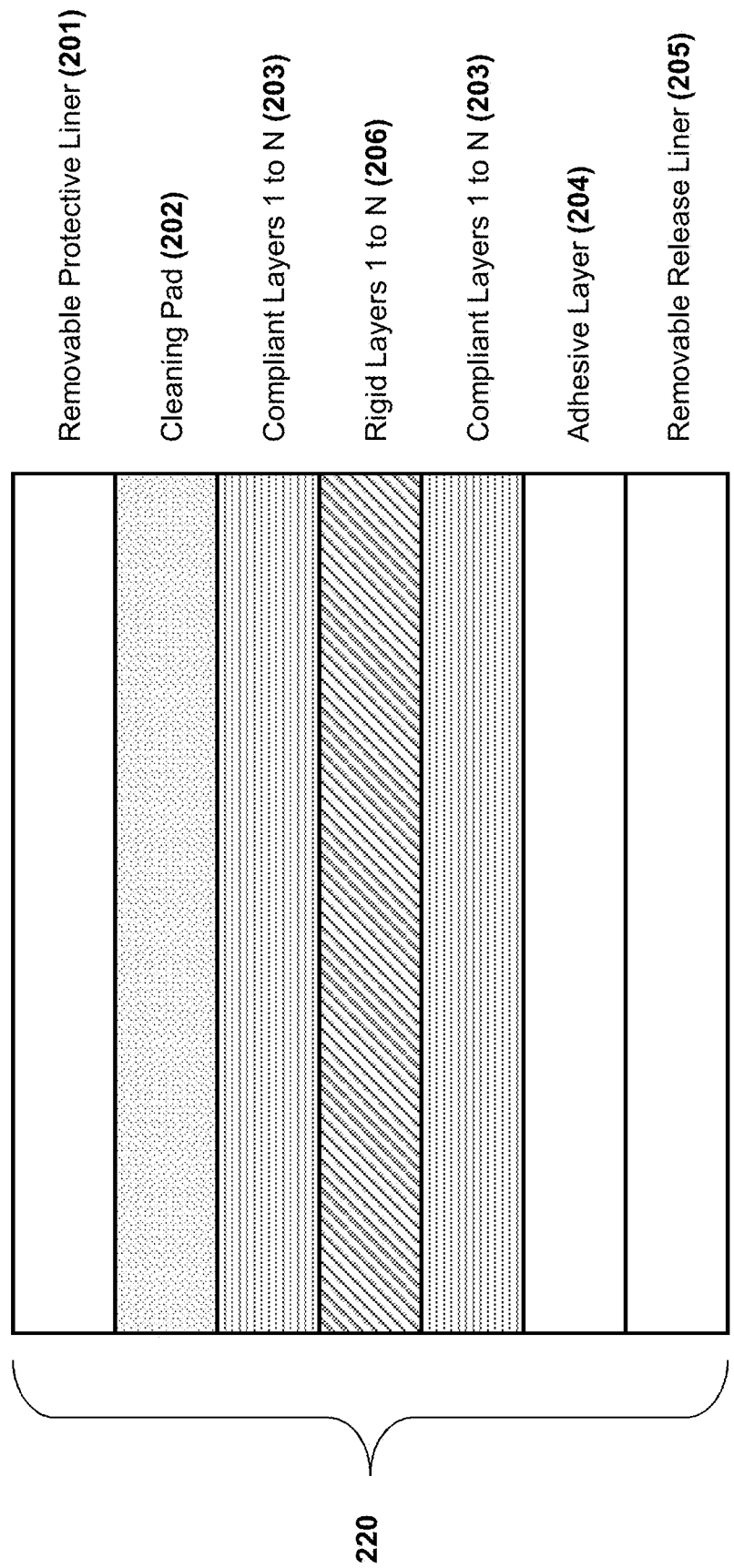
FIG. 7D is a sectional view of the second embodiment of the cleaning medium with one or more alternating intermediate rigid and compliant material layers beneath a cleaning pad layer of predetermined properties.

FIG. 7D shows an embodiment wherein the cleaning medium 220 that is constructed by alternating one or more intermediate rigid 206 and one or more compliant material layers 203 beneath a cleaning pad layer 202 of predetermined properties. In this embodiment, the cleaning medium 220 has one or more compliant layers 203 underneath the cleaning pad 202 and then the one or more rigid layers 206 and the one or more compliant layers 203, although the cleaning medium 220 may have the alternating compliant layers and rigid layers in a different configuration that is within the scope of the disclosure. In this embodiment, the cleaning pad 202 and underlayers (203, 206, etc.) will have predetermined abrasive, density, elasticity, and/or tacky properties that contribute to cleaning the pickup tool contact surface, sides, and vacuum inlet/outlet. Superposition of the cleaning layer and intermediate material layer properties may be varied according the specific configuration and geometrical features of the pickup tool contact surface, sides, and vacuum inlet/outlet.

The abrasiveness of the cleaning pad layer 202 will loosen and shear debris from the pickup tool contact surface, sides, and vacuum inlet/outlet. Using predetermined volumetric and mass densities of abrasive particles; the abrasiveness of the cleaning material can be systematically affected in order to facilitate debris removal. Typical abrasive material and particle weight percentage loading within the cleaning material layer can range for 30% to 500% weight percent. As used herein, weight percent polymer loading is defined as the weight of polymer divided by the weight of polymer plus the weight of the abrasive particle. Typical abrasives that may be incorporated into the materials may include aluminum oxide, silicon carbide, and diamond although the abrasive material may also be other well-known abrasive materials. The abrasive may include spatially or preferentially distributed particles of aluminum oxide, silicon carbide, or diamond although the abrasive particles may also be other well-known abrasive materials with Mohs Hardness of 7 or greater. Controlled surface tackiness of the cleaning layer will cause debris on the pickup tool contact surface, sides, and vacuum inlet/outlet to preferentially stick to the pad and therefore be removed from the pickup tool contact surface, sides, and vacuum inlet/outlet during the cleaning operation.

In one embodiment, the cleaning material layer 202, and/or the intermediate rigid layers 206, and/or intermediate compliant layers 203 (each being a "material layer") may be made of a solid or foam-based, with open or closed cells, elastomeric materials that may include rubbers and both synthetic and natural polymers. Each material layer may have a modulus of Elasticity with a range between more than 40-MPa to less than 600-MPa and the range of thickness of the layers may be between 25-um or more and less than or equal to 500-um. Each material layer may have a hardness range of layers between 30 Shore A or more and not to exceed 90 Shore A. The cleaning and adhesive layers may have a service range of between −50 C to +200 C. Each elastomeric material may be a material manufactured with a predetermined tackiness or abrasive particles spatially or preferentially distributed within the body of the material. Each material may have a predetermined elasticity, density and surface tension parameters that may allow the pickup tool contact surface, sides, and vacuum inlet/outlet to penetrate the elastomeric material layers and remove the debris on the vacuum pick-up tool without damage to the geometrical features of the pickup tool contact surface, sides, and vacuum inlet/outlet, while retaining the integrity of the elastomeric matrix. Each material layer will have a predetermined thickness generally between 1 and 20 mils thick. The thickness of each layer may be varied according the specific configuration of the pickup tool contact surface, sides, and vacuum inlet/outlet. For example, a thin material cleaning material layer (~1-mil thick) would be suitable for a "non-penetrating" geometry such as a flat tube and a thick material cleaning layer (~20-mil) would be well-suited for a "penetrating" tube geometry. As one or more assembly elements and supporting hardware of the assembly equipment the cleaning pad during the normal operation of the automated, semi-automated, or manual cleaning, a vertical contact force drives the contact element into the pad where the debris on the pickup tool contact surface, sides, and vacuum inlet/outlet will be removed and retained by the pad material.

Figure 8A:
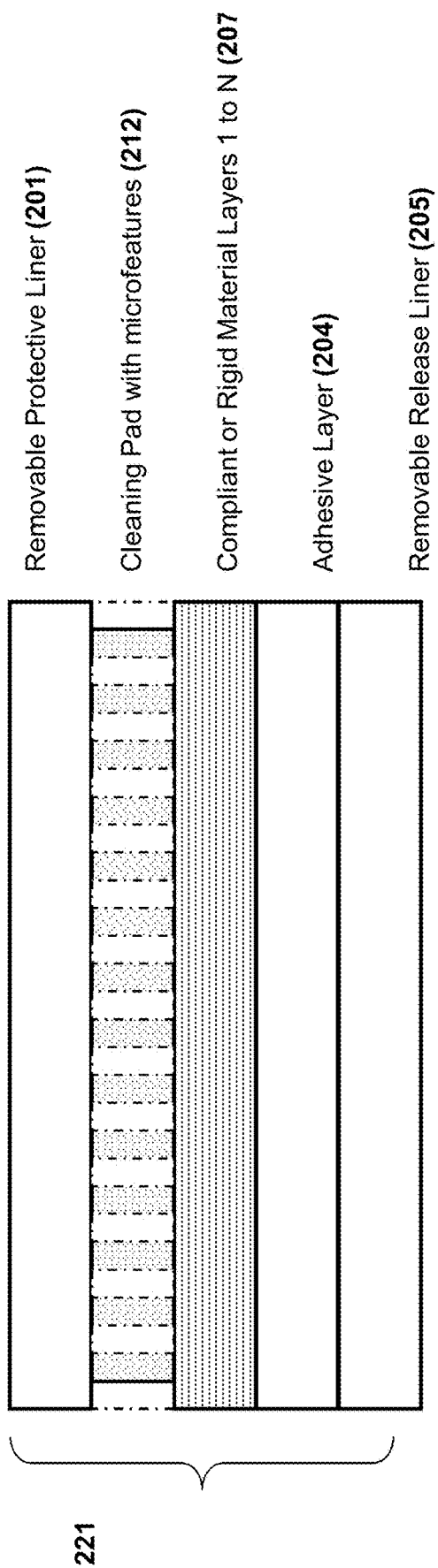
FIG. 8A is a sectional view of a third embodiment of a cleaning material with evenly spaced micro-columns of a predetermined geometry constructed onto one or more material layers of predetermined properties.
Figure 8B:
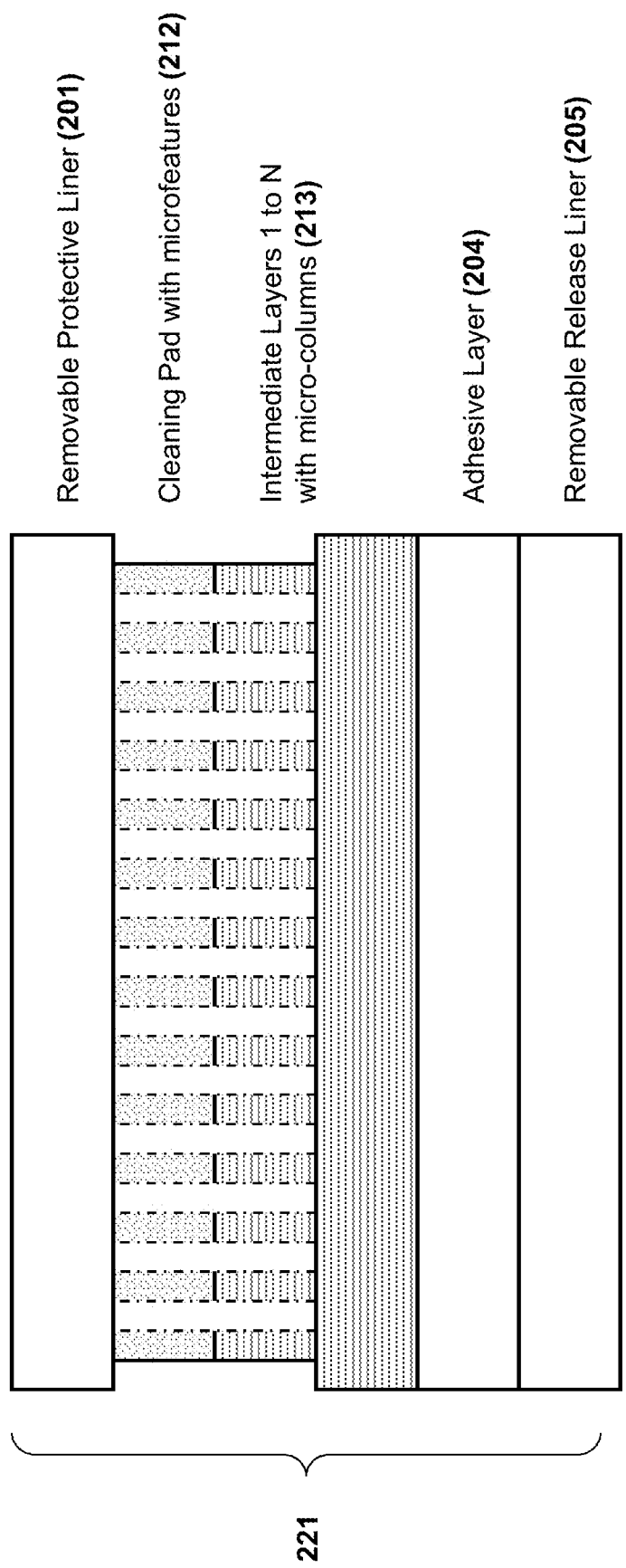
FIG. 8B is a sectional view of a of a fourth embodiment of a cleaning material with evenly spaced micro-columns of a predetermined geometry constructed from a combination of one or more intermediate rigid and compliant material layers of predetermined properties.

In other embodiments of the a cleaning medium 221 (shown in FIGS. 8A and 8B), the maximum cleaning efficiency of the cleaning material can be improved using a plurality of uniformly shaped and regularly spaced, geometric micro-features 212, such as micro-columns or micro-pyramids, of a pre-determined aspect ratio (diameter to height), cross-section (square, circular, triangular, etc.). In the embodiment in FIG. 8A, the spaced microfeatures are constructed from a single layer 212 op top of and across a combination of intermediate compliant or rigid layers 207 with pre-determined predetermined properties. As an example of one type of micro-feature construction, the square micro-columns shown in FIG. 8A can be created using a combination of precision fabrication processes and/or controlled cutting methods whereby the major axis has a dimension of 100-micron or less and the "street" and "avenue" widths are less than 50-um. The depth of the "streets" and "avenues" is controlled by the cutting methods in order to attain the aspect ratio. In this example, the features have a 100-micron major axis width to a 200-micron depth (or height). In this construction, the depth is attained without cutting through the cleaning material layer or into the underlayer(s). In the embodiment in FIG. 8B, the evenly spaced microfeatures may be constructed from multiple layers 213 of intermediate compliant or rigid layers 207 with pre-determined properties. The size and geometry of the micro-features may vary according the configuration and material of the pickup tool contact surface, sides, and vacuum inlet/outlet to achieve a pad that will remove the debris but will not damage the pickup tool contact surface, sides, and vacuum inlet/outlet. If the micro-features are large relative to the contact element geometry, this will adversely affect the cleaning performance. If the micro-features are small relative to the contact element geometry, the reciprocal force will be insufficient to facilitate a high cleaning efficiency to remove adherent contaminants.

Generally, the microfeatures can have several types of geometries including cylinders, squares, triangles, rectangles, etc. The cross-sectional size in major axis of each micro-feature may be greater than or equal to 25-um and smaller than 500-um and each micro-feature may have an aspect ratio (height to width) that ranges between 1:10 to 20:1. The micro-feature geometry may be adjusted during the manufacturing of a cleaning layer such that the material can be used to refurbish the pickup tool contact surface, sides, and vacuum inlet/outlet.

Figure 9A:
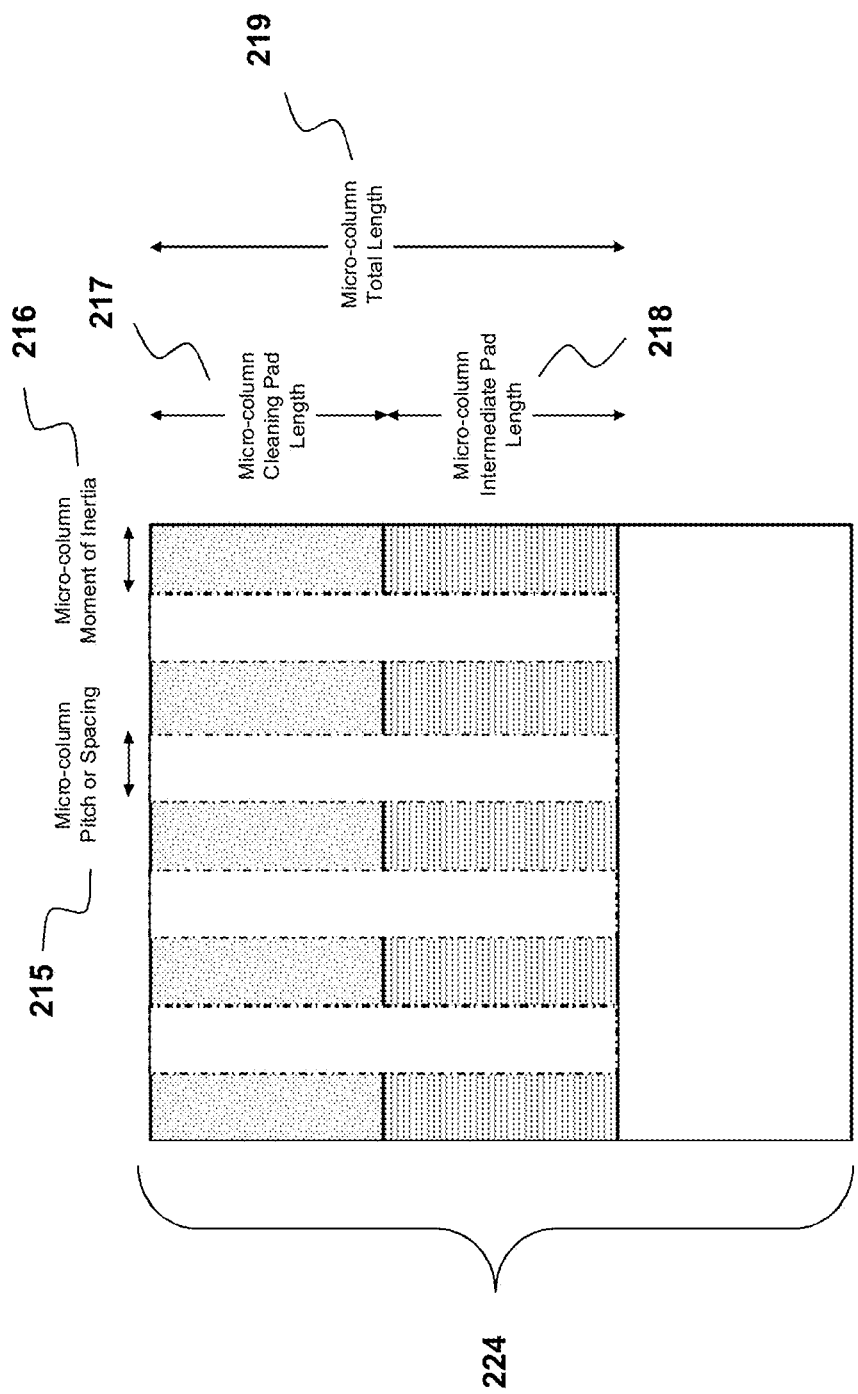
FIG. 9A is an enlarged sectional view of an evenly spaced micro-columns shown in FIG. 8B constructed from a combination of one or more intermediate material layers to attain a consistent cleaning efficacy into the contact area of the vacuum and suction pickup tools of the pick-and-place assembly.
Figure 9B:
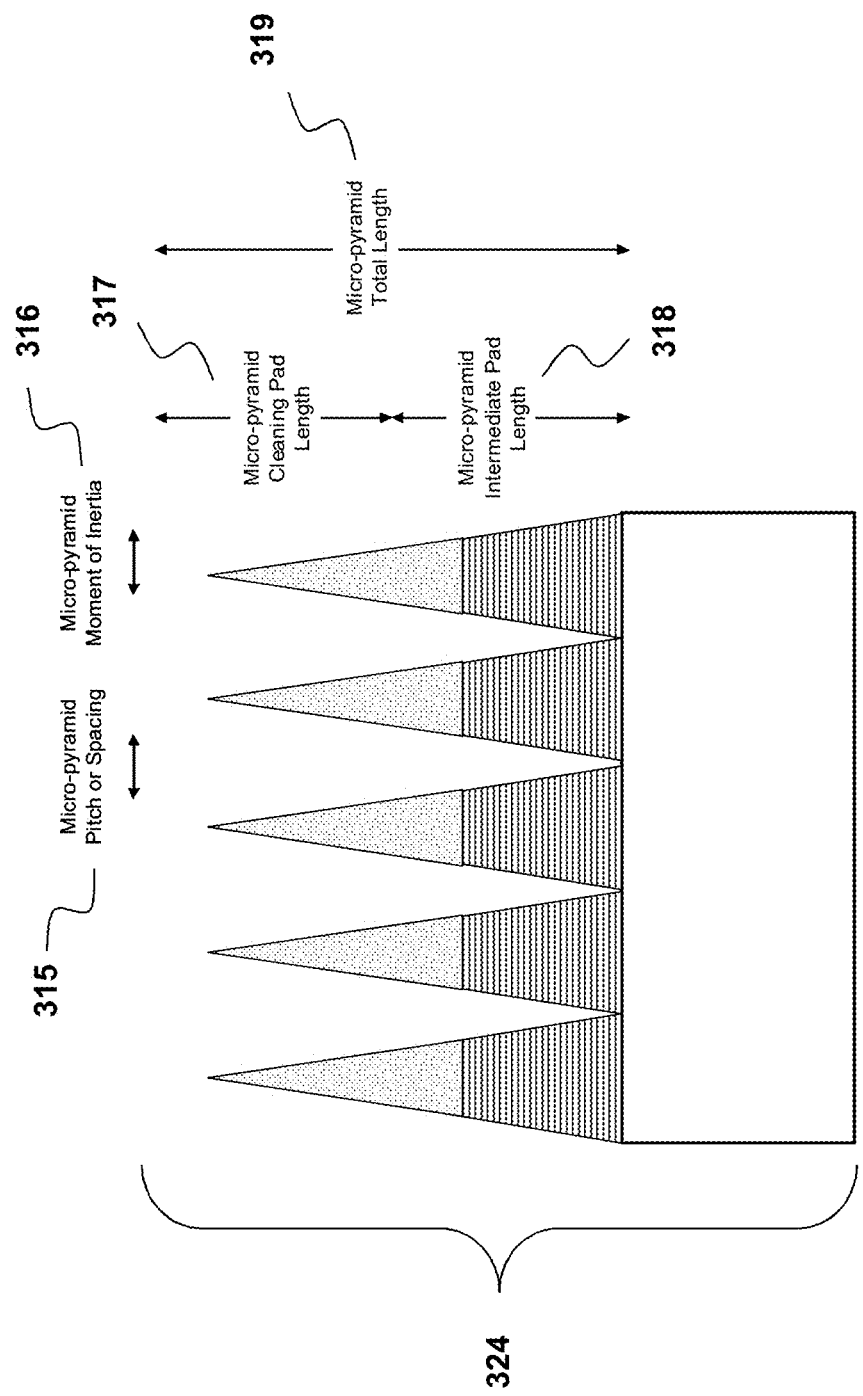
FIG. 9B is an enlarged sectional view of a fifth embodiment of a cleaning material with evenly spaced micro-pyramids constructed from a combination of one or more intermediate material layers to attain a consistent cleaning efficacy into the contact area of the vacuum and suction pickup tools of the pick-and-place assembly.

In the embodiments in FIG. 9A and FIG. 9B, showing enlarged sectional views of a cleaning materials with micro-features (micro-columns 219 in FIG. 9A and micro-pyramidal 319 in FIG. 9B features of the cleaning material 224, 324, respectively); although, such features also could be any other regular geometrical feature. The deflection of a micro-feature under load depends not only on the load, but also on the geometry of the feature's cross-section.

In the embodiment in FIG. 9A, the micro-column spacing, or pitch, 215; the area moment of inertia 216 or the second moment of inertia which is a property of a shape can both be used to predict the resistance of features to bending and deflection, the cleaning pad length 217; the intermediate pad length 218; and the total length of the micro-column 219 are predetermined according the specific configuration of the pickup tool contact surface, sides, and vacuum inlet/outlet. For the pickup tool contact surface, sides, and vacuum inlet/outlet, the micro-column geometry is such that the cleaning features can fit "into the inlet/outlet" as well as make physical contact along the tool sides to provide cleaning action and debris collection. In this example, the vacuum inlet/outlet could have a diameter of 125-microns. For the cleaning material, the feature major cross-sectional axis length would be less than 125-micron and the height would be at least 60-micron to facilitate overtravel into the cleaning material.

FIG. 9B, the micro-pyramid vertex spacing, or pitch, 315 and the variable moment of inertia 316 along the height, the cleaning pad pyramidal length 317, the pyramidal frustum height 318, and the total height of the micro-pyramid 319 are similarly predetermined according the specific configuration of the vacuum pick-up tool. As an example, the micro-pyramid geometry is such the cleaning material can fit into the pickup tool contact surface, sides, and vacuum inlet/outlet to provide cleaning action and debris collection inside the pickup tool contact surface, sides, and vacuum inlet/outlet and along the sides of the pickup tool. For a particular the pickup tool configuration, the micro-feature geometry is such that the cleaning features can fit into the pickup tool contact surface, sides, and vacuum inlet/outlet and along the sides of the pickup tool contact surface, sides, and vacuum inlet/outlet to provide cleaning action and debris collection. The shape of the micro-feature would be defined by the kerf (i.e, "street width and shape", and "avenue width and shape") if a precision cutting process is used or through a molded shape if a casting process is used. For the micro-features of the cleaning material, the major cross-sectional axis length of the micro-feature top surface would be less than 125-micron to facilitate within the pickup collet cleaning. The overall height would be at least 200-micron to facilitate overtravel into the cleaning material and provide a enough reciprocal force to initiate the cleaning and/or material removal action.

The micro-features described above may have abrasive particles applied to the top surface, along the length of the micro-feature, within the body of the micro-feature, or at the base of the micro-feature. In one embodiment, an average micro-feature could have a cross-section width of 1.0-µm or more, with a height of 400-µm or less and an average abrasive particle size of less than 15.0-µm. Typical abrasives that may be incorporated into and across the material layers and micro-features may include aluminum oxide, silicon carbide, and diamond although the abrasive particles may also be other well-known abrasive materials with Mohs Hardness of 7 or greater. The amount and size of the abrasive material added to the micro-features may vary according the configuration and material of the pickup tool contact surface and vacuum inlet/outlet to achieve a pad that will remove and collect the debris but will not cause damage.

FIGS. 10A, 10B, and 10C are diagrams illustrating an embodiment of the cleaning material 226 and 326, respectively, in which the micro-features are mutually decoupled and formed with a predetermined moment of inertia using predetermined arrays of streets 351, avenues 352, and diagonals 353 to remove undesirable interactions and other coupled effects and attain a predetermined surface compliance so that when the vacuum pick-up tool contacts the pad surface, a reciprocal force is imparted by the material into the contact area, within the contact element tip geometry, and support structures to increase the efficiency at which the debris and contaminates are removed. The widths of the streets, avenues, and diagonals size may vary according the configuration and material of the vacuum pick-up tool to achieve a decoupled material surface to uniformly remove the debris from the sides of the contact element and within the geometrical features contact element tip. The streets, avenues, and diagonals may have abrasive particles uniformly or preferentially distributed across the width. The width of the streets, avenues, and diagonals as well as the size of the abrasive material across the width may vary according the configuration and material of the pickup tool contact surface, sides, and vacuum inlet/outlet. In these embodiments, each island 360 of the cleaning material is a micro-feature that is separated from other micro features.

The cleaning system and cleaning pad not only removes and collects adherent particulates from the pickup tool contact surface, sides, and vacuum inlet/outlet, but does not affect the overall shape and geometric properties. The insertion of the pickup tool contact surface, sides, and vacuum inlet/outlet into a cleaning device, such as the devices shown in FIG. 6A carrier device 20; FIG. 6B substrate device 21; and FIG. 6C dummy package device 22, removes adherent debris and supporting hardware without leaving any organic residue that must be subsequently removed with an additional on-line of off-line process.

The in-situ method of cleaning pickup tool contact surface, sides, and vacuum inlet/outlet accomplishes the goal of cleaning the pickup tool without removing the tool from the handling machine, thereby reducing downtime and increasing the productivity. The cleaning material is installed on a clean bock or station at a predefined position and when the cleaning algorithm is initiated manually, semi-automatically or automatically the machine moves the pickup tool to the predefined location where the cleaning material has been installed and then the pickup tool is inserted into the clean material. The cleaning material layer of the device has predetermined physical, mechanical, and geometrical properties according the configuration and material pickup tool contact surface, sides, and vacuum inlet/outlet.

Figure 11A:
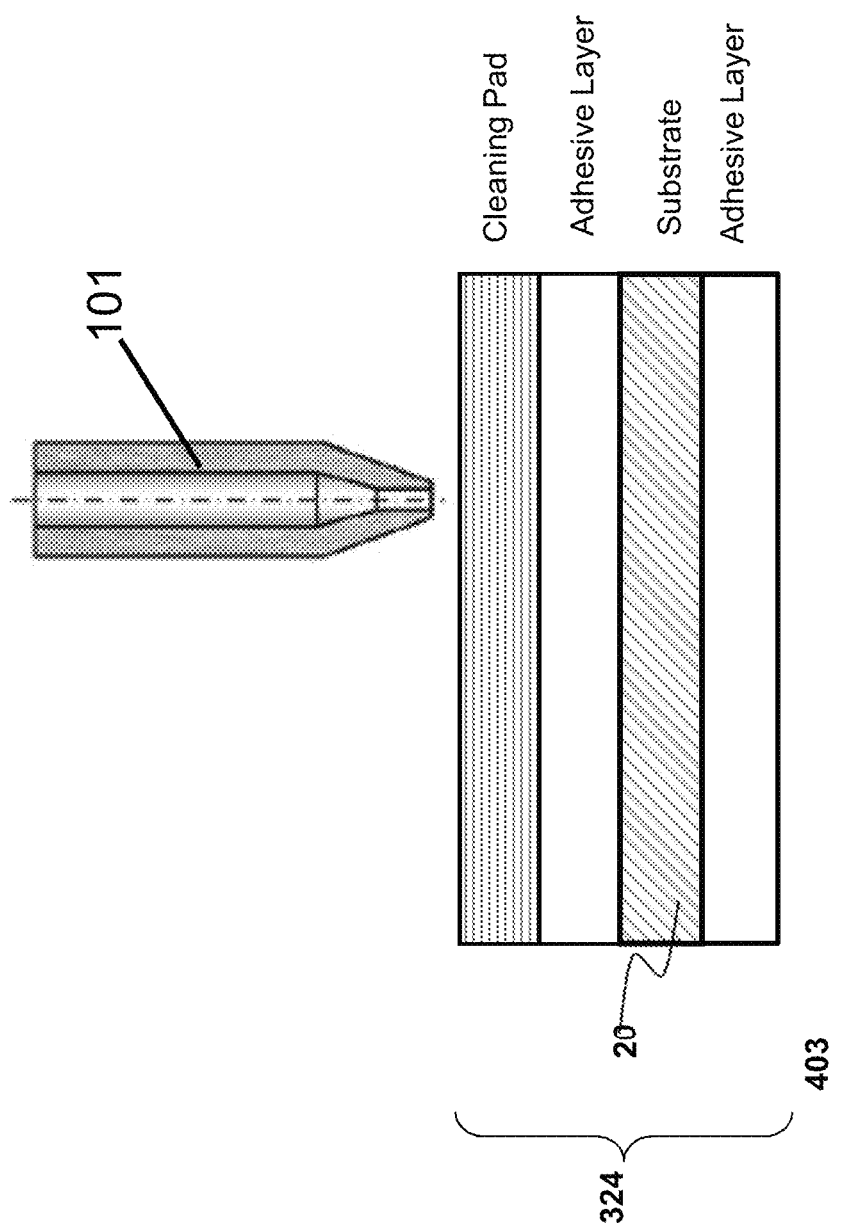
FIGS. 11A, 11B, and 11C are sectional views of the cleaning material with a carrier substrate in FIG. 6A for cleaning the sides, interior, and contact area of the vacuum and suction pickup tools of the pick-and-place assembly.
Figure 11B:
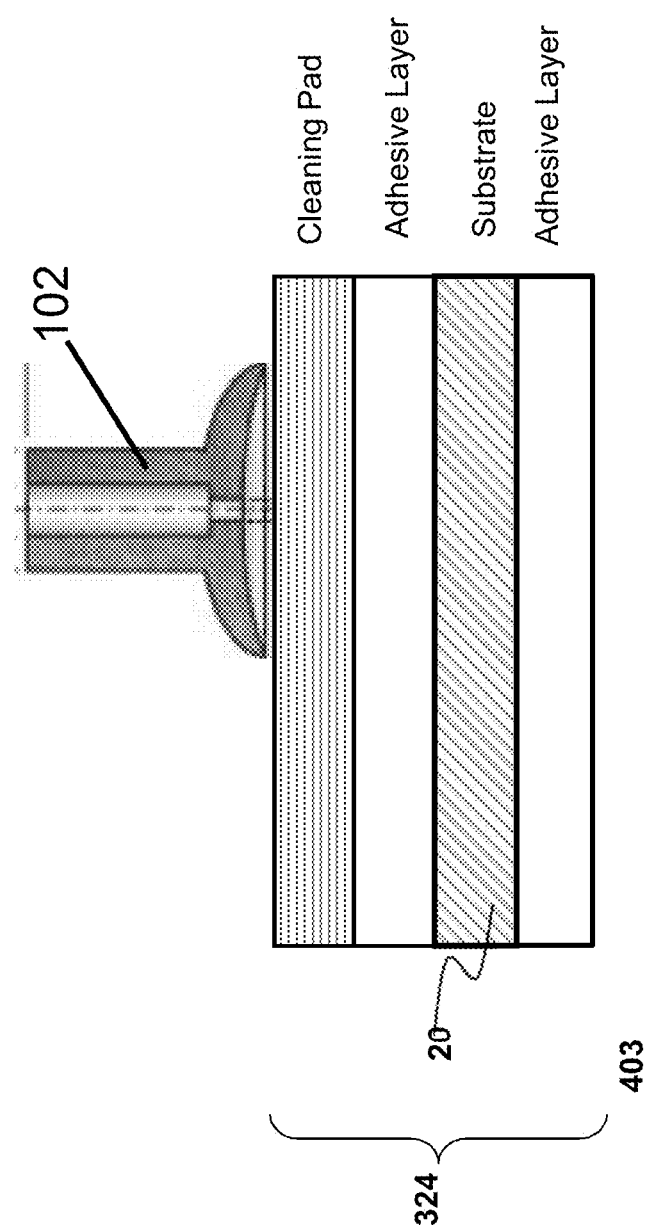
Figure 11C:
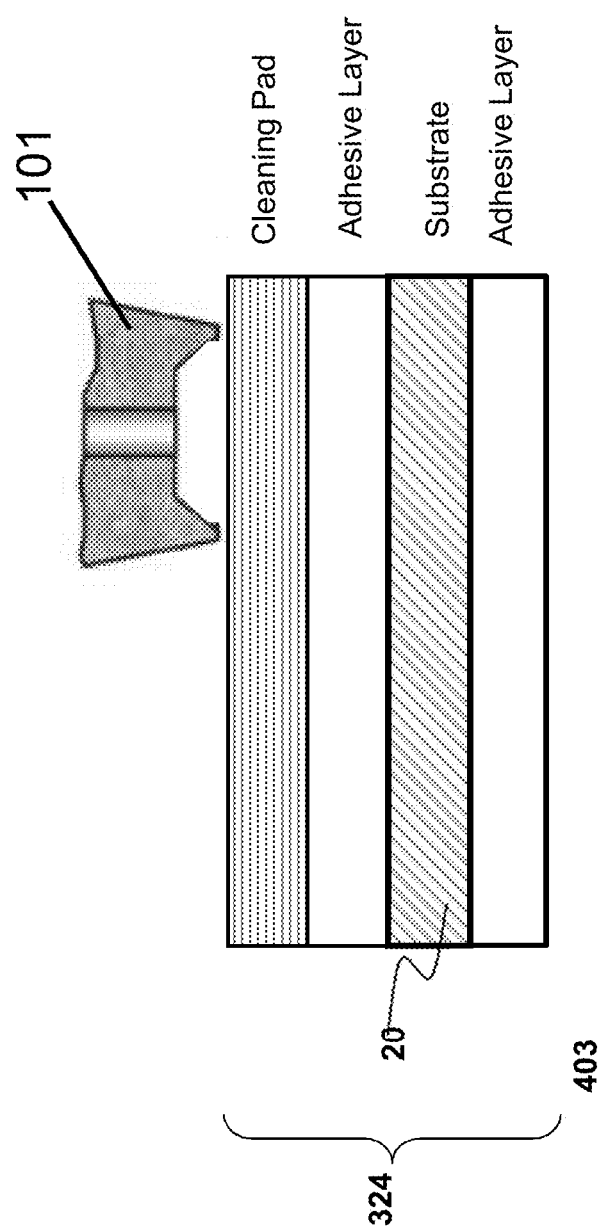
Figure 12A:
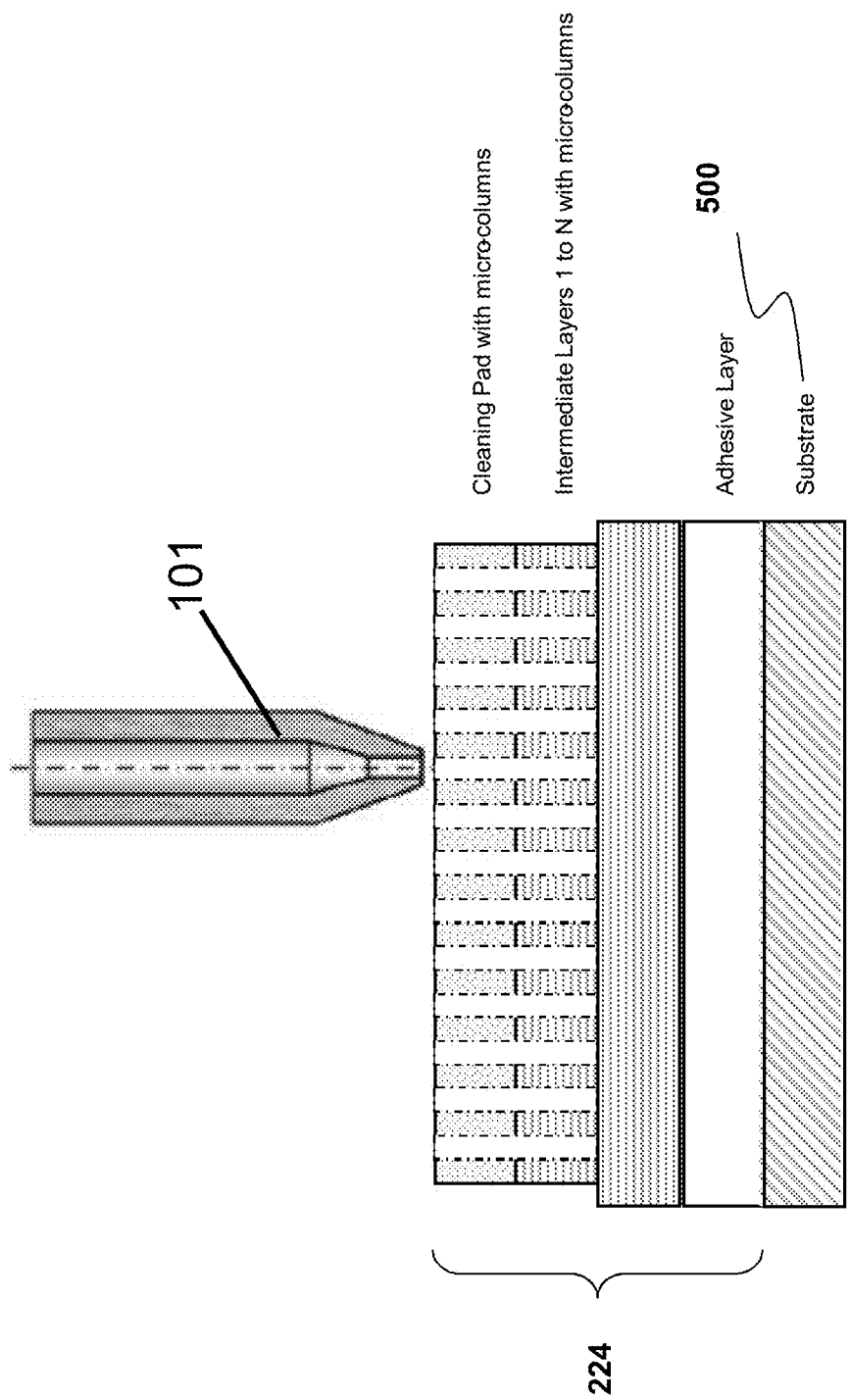
FIGS. 12A, 12B, and 12C are sectional views of the cleaning material with micro-columns in FIGS. 8B and 9A for cleaning the sides, interior, and contact area of the vacuum and suction pickup tools of the pick-and-place assembly.
Figure 12B:
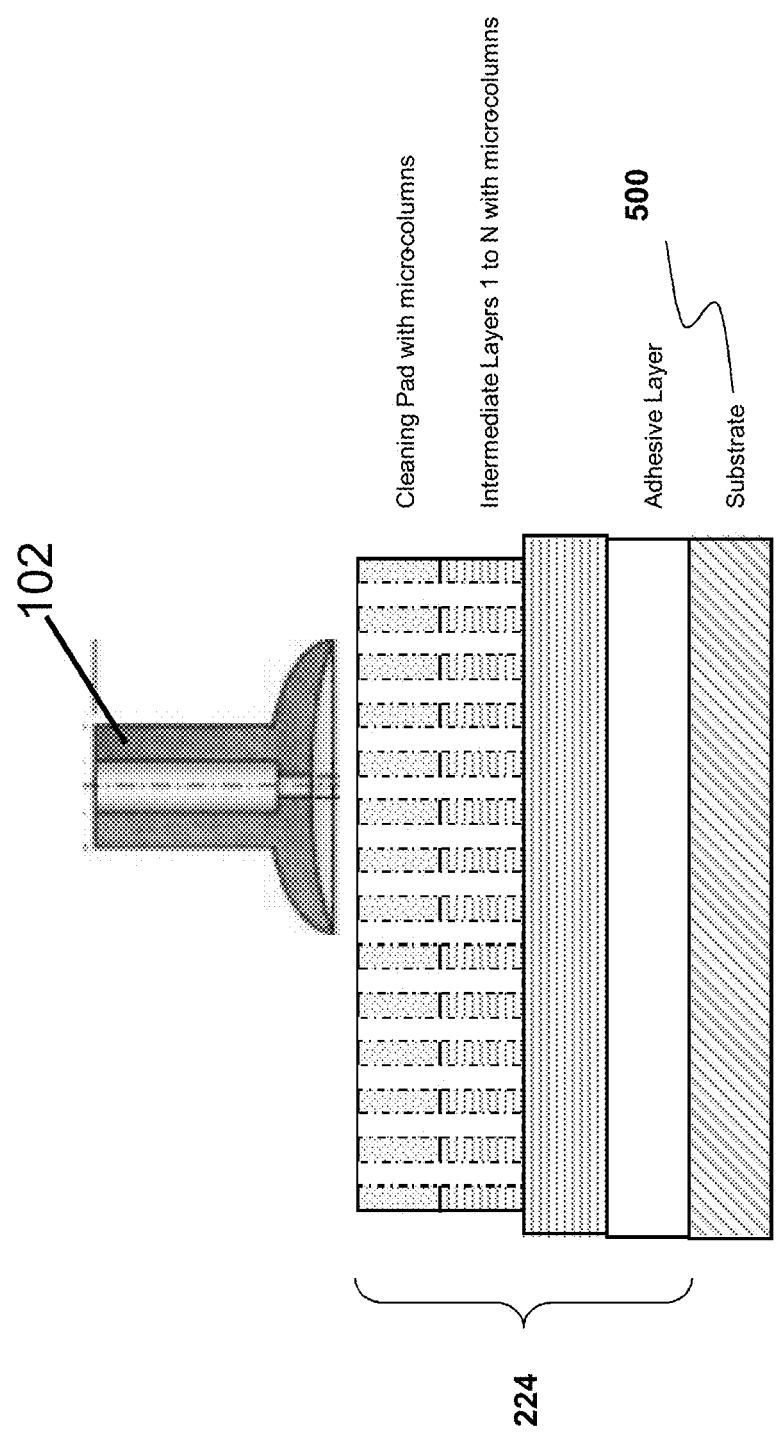
Figure 12C:
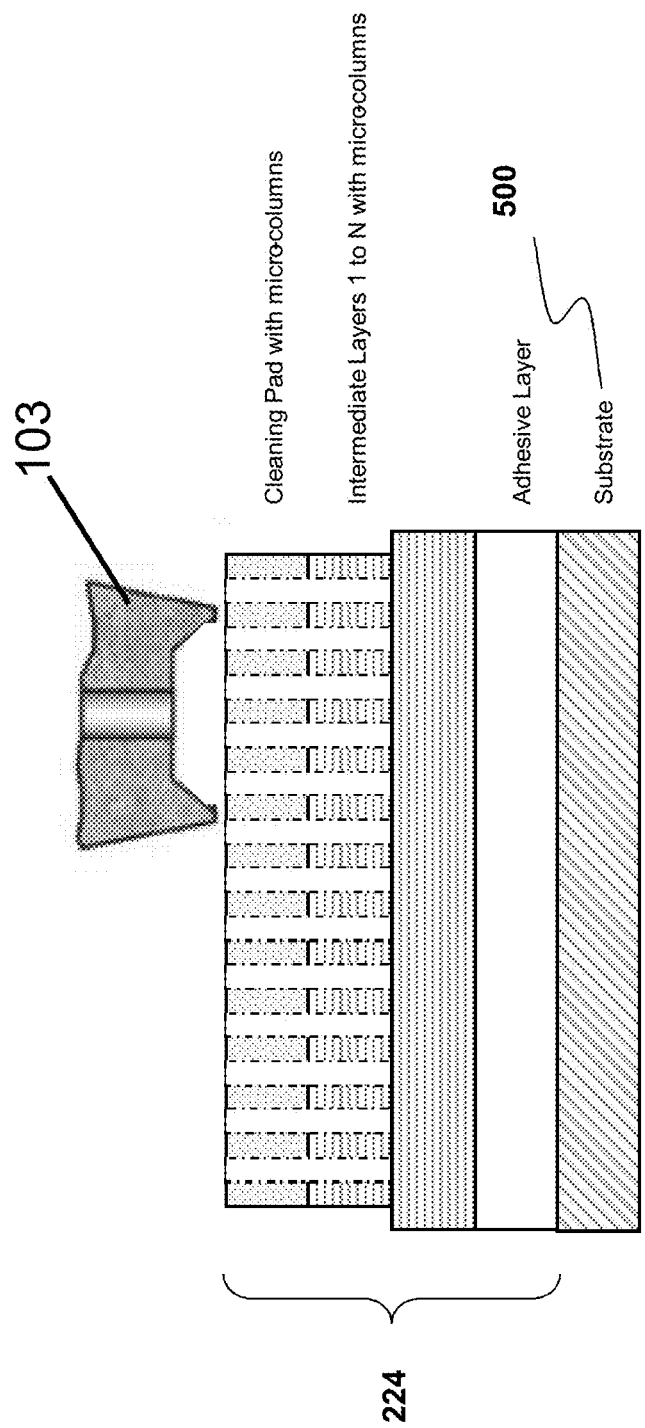
Figure 13A:
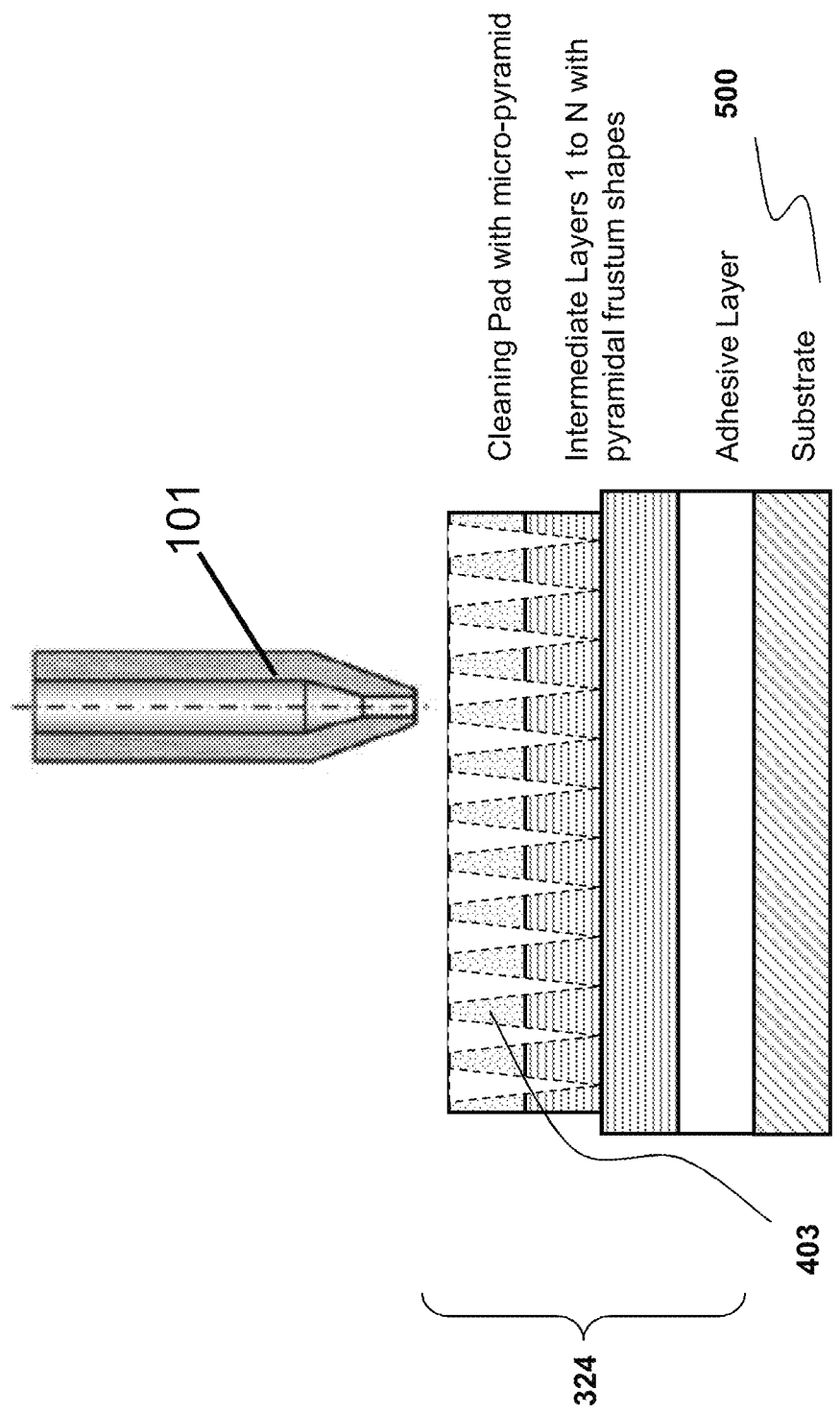
FIGS. 13A, 13B, and 13C are sectional view of a cleaning material with micro-pyramids in FIG. 9B for cleaning the interior, and contact area of the vacuum and suction pickup tools of the pick-and-place assembly.
Figure 13B:
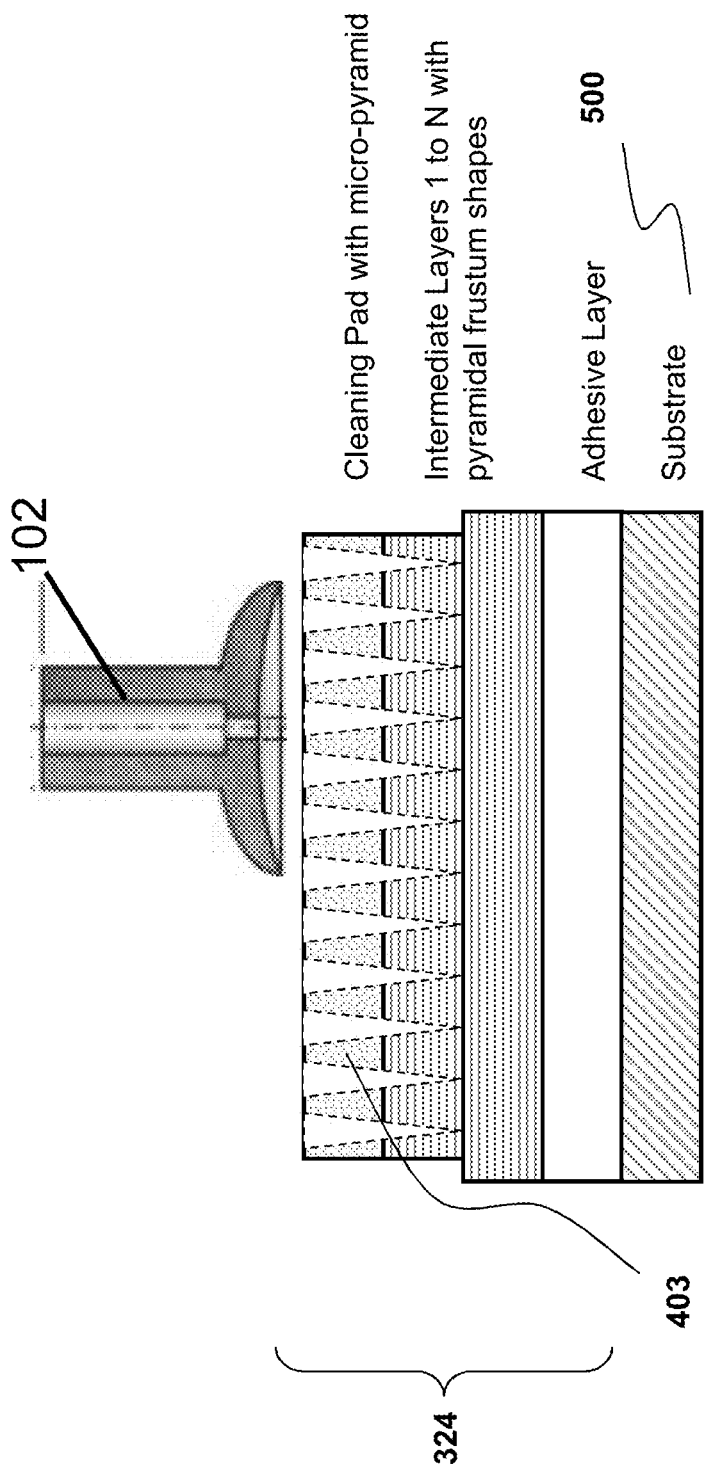
Figure 13C:
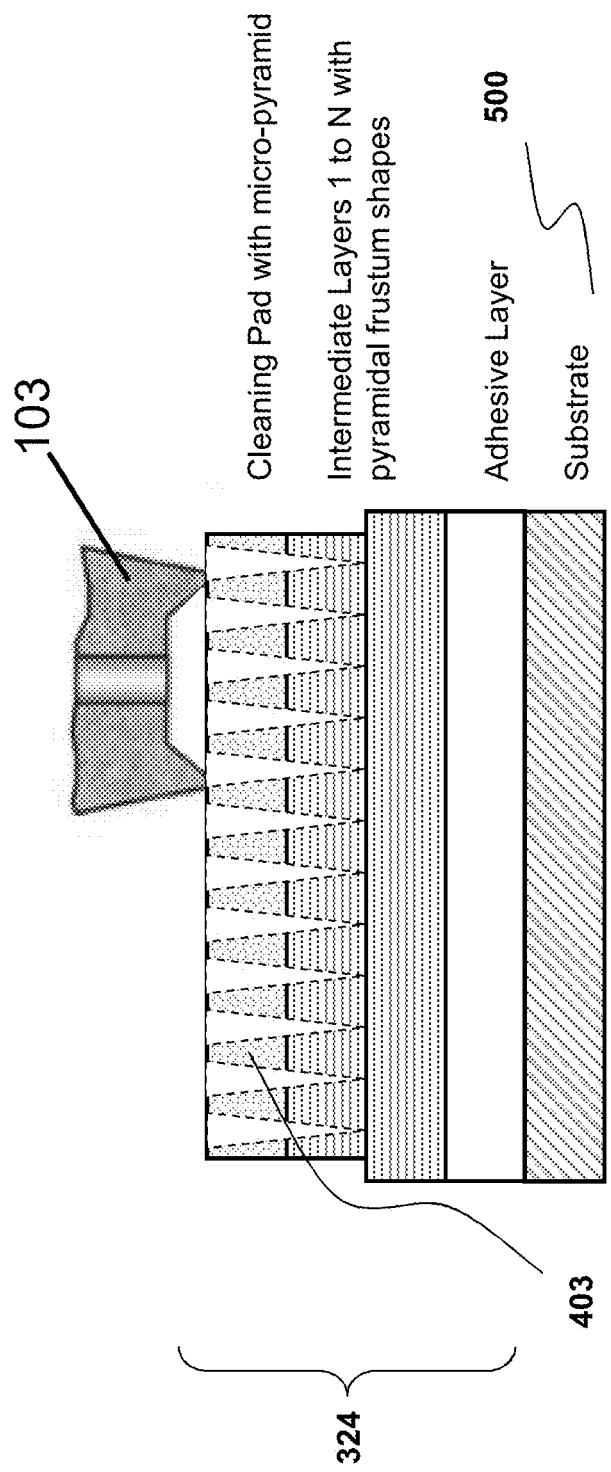

An embodiment of the cleaning material with the micro-features suitable for cleaning a conical vacuum pickup tool (101) is shown in FIG. 11A; a suction cup vacuum pickup tool (102) is shown in FIG. 11B; and a multi-sided vacuum collet pickup tool (103) in FIG. 11C. For this illustrative example, standard pickup tools are shown but not the other well-known elements of a handling machine. The cleaning material 324 is installed onto a carrier substrate 20 (as shown in FIGS. 11A-11C) or a cleaning area substrate 500. During the cleaning performance, the handling machine would be programmed to move (manually, semi-automatically and/or automatically) to a location of the cleaning block/pad so that the pickup tool may be inserted into the cleaning material. At a specified interval or "on-demand", the pickup tool is cleaned as the cleaning material 324 is driven into contact to a pre-set vertical position.

The cleaning material 324 shown in FIGS. 11A-11C may have the micro-features as described above. The micro-features (that may be micro-columns) may be used wherein the geometrical features of the cleaning device have spacing, geometry, and abrasiveness of the micro-columns is such that the reciprocal pressure on the pickup tool imparts efficient cleaning to remove and collect debris. The spacing 215, moment of inertia 216, and total length 219 of the micro-columns configured based on the configuration and material of the pickup tool contact surface, sides, and vacuum inlet/outlet diameter (101, 102, 103). As the pickup tools (101, 102, 103) are exercised into the cleaning material 324, debris is removed from the surface as well as inside of the inlet/outlet. The number of pad/polymer/substrate layers and surface micro-features may be controlled to provide control of the overall thickness of the cleaning device as well as the compliance of the thickness of the cleaning. This multi-layer embodiment provides efficient "edge-side" cleaning for the interior of the multi-sided vacuum collet pickup tool.

As described above, the cleaning operation does not affect in any way, the operation of the handling machine since the cleaning of pickup tool contact surface, sides, and vacuum inlet/outlet is accomplished during the normal operation. In this manner, the cleaning operation is inexpensive and permits the pickup tool contact surface, sides, and vacuum inlet/outlet to be cleaned without excessive downtime and throughput loss.

In the micro-featured embodiment shown in FIGS. 12A-13C, the micro-features (micro-columns 224 in FIGS. 12A-12C or the micro-pyramid structures 324 in FIGS. 13A-13C) may be used wherein the geometrical features of the cleaning device have spacing, geometry, and abrasiveness of the micro-pyramids is such that the reciprocal pressure on the pickup tool imparts efficient cleaning to remove and collect debris. The decoupling of the micro-features with streets 350, avenues 351, and diagonals 352, with widths and depths is predetermined according to the configuration and material the pickup tool contact surface, sides, and vacuum inlet/outlet. The number of pad/polymer/substrate layers and surface micro-features may be controlled to provide control of the overall thickness of the cleaning device as well as the compliance of the thickness of the cleaning. This multi-layer embodiment provides efficient "edge-side" cleaning for the interior of the multi-sided vacuum collet pickup tool.

FIG. 14A is an example of a vacuum collet 1400 before cleaning using the cleaning device and FIG. 14B is an example of the vacuum collet 1400 after cleaning using the cleaning device. The vacuum collet 1400 has a contact surface 1402 that has a circular shape with an internal void area. As shown in FIG. 14A, the uncleaned vacuum collet 1400 has one or more pieces of debris 1404 on the contact surface 1402 for a Pick-and-Place machine that accumulate after repeated pick-up and place actions. The adherent debris 1404 will affect the vacuum seal quality between the collet and device being picked and placed to reduce the vacuum force. The pieces of debris 1404 cause unscheduled downtime that is needed to manually clean the debris and recover the collet performance. When the vacuum collet is cleaned using the cleaning material and the cleaning process disclosed above, the vacuum collet was brought into contact with the surface of cleaning material and the adherent debris was removed from the contact surface 1402 and along the sides of the collet tip as shown in FIG. 14B. As needed, the collect can be actuated into the cleaning polymer multiple times to remove the adherent debris. The cleaning of the collet contact surface 1402 as shown in FIG. 14B can be performed without taking the system off-line for unscheduled maintenance.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include an/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. An apparatus, comprising:
a semiconductor device handling machine having a pick and place apparatus, the pick and place apparatus having a contact element with an inner surface and an outer surface and the contact element contacts and picks one of a device and a component using suction;
a cleaning material attached to a substrate that is positioned adjacent to the pick and place apparatus, the cleaning material having a top layer that is contacted by the contact element of the pick and place apparatus during a cleaning process wherein the top layer has a plurality of microfeatures having a spacing between the microfeatures, a moment of inertia of each microfeature and a total length of each microfeature determined based on at least a diameter of the contact element of the pick and place apparatus that cleans an inside and outside surface of the contact element and a textured surface that cleans the inside and outside surface of the contact element; and
wherein the contact element is cleaned while the contact element is attached to the pick and place apparatus by inserting an end of the contact element into the cleaning material; and wherein the pick and place apparatus performs the pick and place operation once the contact element is cleaned.

2. The apparatus of claim 1, wherein the cleaning material further comprises a surface tackiness that causes a piece of debris on the contact surface to transfer to the cleaning material.

3. The apparatus of claim 2, wherein the surface tackiness is in a range between 20 grams and 800 grams.

4. The apparatus of claim 1, wherein the one or more microfeatures are one of microcolumns and micropyramids.

5. The apparatus of claim 1, wherein the cleaning material further comprises one or more intermediate layers underneath the cleaning pad layer that support the cleaning pad layer.

6. The apparatus of claim 5, wherein the one or more intermediate layers are one of rigid layers, compliant layers and rigid and compliant layers.

7. The apparatus of claim 5, wherein the cleaning material further comprises a release layer on top of a top surface of the cleaning pad layer that protects the cleaning pad layer.

8. The apparatus of claim 1, wherein the cleaning material further comprises a substrate on top of which a cleaning pad layer is supported.

9. The apparatus of claim 1, wherein the pick and place apparatus further comprises one of a pick and place apparatus for a packaged device being tested and a pick and place apparatus for a component used in a surface mount process.

10. The apparatus of claim 1, wherein the pick and place apparatus further comprises one of a pick and place apparatus for a die attach machine and a pick and place apparatus for a flip-chip bonder machine.

11. The apparatus of claim 1, wherein the contact element further comprises one of a vacuum aperture, a nozzle, a suction cup, a suction inlet, a vacuum collet of the pick and place apparatus.

12. The apparatus of claim 1, wherein the cleaning layer has a set of microfeatures and an array of streets, avenues or diagonals that decouple each microfeature from each other microfeature and a width of each street, avenue or diagonal is based on a dimension of the contact element of the pick and place apparatus.

* * * * *